(12) United States Patent
Yoon et al.

(10) Patent No.: US 11,502,156 B2
(45) Date of Patent: Nov. 15, 2022

(54) STRETCHABLE DISPLAY DEVICE INCLUDING COMMON ANODE STRUCTURE

(71) Applicant: LG Display Co., Ltd., Seoul (KR)

(72) Inventors: DooHyun Yoon, Seoul (KR); HyeSeon Eom, Seoul (KR); GyungMin Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 175 days.

(21) Appl. No.: 17/031,597

(22) Filed: Sep. 24, 2020

(65) Prior Publication Data

US 2021/0126082 A1     Apr. 29, 2021

(30) Foreign Application Priority Data

Oct. 24, 2019 (KR) ........................ 10-2019-0133255

(51) Int. Cl.
   *H01L 27/32*       (2006.01)
   *H01L 51/52*       (2006.01)

(52) U.S. Cl.
   CPC ...... *H01L 27/3276* (2013.01); *H01L 27/3262* (2013.01); *H01L 51/5271* (2013.01); *H01L 2251/5338* (2013.01)

(58) Field of Classification Search
   CPC ............. H01L 27/3276; H01L 27/3262; H01L 51/5271; H01L 51/0097; H01L 2251/5338
   USPC ....................................................... 257/40
   See application file for complete search history.

(56) References Cited

U.S. PATENT DOCUMENTS

| 11,183,652 | B2* | 11/2021 | Cho ..................... H01L 51/5253 |
| 11,222,943 | B2* | 1/2022 | Park .................... H01L 27/3244 |
| 2018/0046221 | A1* | 2/2018 | Choi .................. G02B 26/0825 |
| 2019/0280077 | A1* | 9/2019 | Park .................... H01L 27/3258 |
| 2020/0328269 | A1* | 10/2020 | Shin .................... H01L 27/3246 |
| 2021/0225984 | A1* | 7/2021 | Wang ................. H01L 27/3276 |

FOREIGN PATENT DOCUMENTS

| KR | 2006-0085181 A | 7/2006 |
| KR | 2017-0075864 A | 7/2017 |
| KR | 2017-0117995 A | 10/2017 |
| KR | 2019-0005019 A | 1/2019 |

* cited by examiner

*Primary Examiner* — Matthew E. Gordon
(74) *Attorney, Agent, or Firm* — Seed IP Law Group LLP

(57) ABSTRACT

The present disclosure relates to a stretchable display device. The stretchable display device includes a lower substrate, a plurality of pixel substrates which is disposed on the lower substrate to be spaced apart from each other, a plurality of first power lines disposed on the plurality of pixel substrates, a plurality of second power lines disposed on the plurality of pixel substrates, a plurality of driving transistors which is disposed on the plurality of pixel substrates and is electrically connected to the plurality of second power lines, and a plurality of light emitting diodes which is disposed on the plurality of pixel substrates and includes an anode electrically connected to the plurality of first power lines and a cathode electrically connected to the plurality of driving transistors. Accordingly, instead of the driving transistor, the anode of the light emitting diode is directly connected to the first power line to achieve a common anode structure, thereby reducing or minimizing fluctuation of the gate-source voltage Vgs of the driving transistor.

24 Claims, 11 Drawing Sheets

STRETCHABLE DISPLAY DEVICE INCLUDING COMMON ANODE STRUCTURE

CROSS-REFERENCE TO RELATED APPLICATIONS

This application claims the priority of Korean Patent Application No. 10-2019-0133255 filed on Oct. 24, 2019, in the Korean Intellectual Property Office, the disclosure of which is incorporated herein by reference.

BACKGROUND

Technical Field

The present disclosure relates to a stretchable display device, and more particularly, to a stretchable display device in which a signal distortion due to voltage drop of a high potential power signal is reduced.

Description of the Related Art

As display devices which are used for a monitor of a computer, a television, or a cellular phone, there are an organic light emitting display device (OLED) which is a self-emitting device and a liquid crystal display device (LCD) which requires a separate light source.

An applicable range of the display device is diversified to personal digital assistants as well as monitors of computers and televisions and a display device with a large display area and a reduced volume and weight is being studied.

Further, recently, a stretchable display device which is manufactured by forming a display unit and a wiring line on a flexible substrate such as plastic which is a flexible material so as to be stretchable in a specific direction and changed in various forms is getting attention as a next generation display device.

BRIEF SUMMARY

One or more embodiments of the present disclosure provides a stretchable display device which reduces a gate-source voltage Vgs fluctuation of a driving transistor due to voltage drop of a power signal.

One or more embodiments of the present disclosure provides a stretchable display device which reduces a resistance of a power line.

One or more embodiments of the present disclosure provides a stretchable display device in which a defect due to a crack and disconnection of a connection line which repeatedly extends is reduced.

One or more embodiments of the present disclosure provides a stretchable display device in which the visibility of the connection line to a user is reduced.

Further embodiments of the present disclosure provides a mirror stretchable display device which improves a reflectance to be used as a mirror.

Technical benefits of the present disclosure are not limited to the above-mentioned benefits, and other benefits, which are not mentioned above, can be clearly understood by those skilled in the art from the following descriptions.

In order to achieve the above-described benefits, according to an aspect of the present disclosure, a stretchable display device includes a lower substrate; a plurality of pixel substrates which is disposed on the lower substrate to be spaced apart from each other; a plurality of first power lines disposed on the plurality of pixel substrates; a plurality of second power lines disposed on the plurality of pixel substrates; a plurality of driving transistors which is disposed on the plurality of pixel substrates and is electrically connected to the plurality of second power lines; and a plurality of light emitting diodes which is disposed on the plurality of pixel substrates and includes an anode electrically connected to the plurality of first power lines and a cathode electrically connected to the plurality of driving transistors. Accordingly, instead of the driving transistor, the anode of the light emitting diode is directly connected to the first power line to achieve a common anode structure, thereby reducing or minimizing fluctuation of the gate-source voltage Vgs of the driving transistor.

According to another aspect of the present disclosure, a stretchable display device includes a lower substrate which includes a plurality of first lower patterns spaced apart from each other and a second lower pattern which encloses the first lower patterns and has a modulus lower than that of the first lower patterns; a plurality of pixel substrates which is disposed on the plurality of first lower patterns and defines a plurality of sub pixels; a plurality of light emitting diodes which is disposed on the plurality of pixel substrates and includes an anode and a cathode; a plurality of driving transistors which is disposed on the plurality of pixel substrates and is electrically connected to the cathode; a plurality of first power lines which is disposed on the plurality of pixel substrates and is electrically connected to the anode; a plurality of second power lines which is disposed on the plurality of pixel substrates and is electrically connected to the plurality of driving transistors; and a plurality of connection substrates which is disposed on the second lower pattern and connects the plurality of pixel substrates. Accordingly, the source electrode of the driving transistor and the first power line are separated so that the distortion of the potential of the source electrode of the driving transistor due to the voltage drop of the high potential power signal may be reduced.

Other detailed matters of the embodiments are included in the detailed description and the drawings.

According to the present disclosure, a luminance uniformity of the stretchable display device may be improved.

According to the present disclosure, a potential of a source electrode of the driving transistor may be controlled regardless of the fluctuation of the high potential power signal.

According to the present disclosure, a common anode structure may be easily implemented.

According to the present disclosure, the gate-source voltage Vgs fluctuation of the driving transistor due to the voltage drop of the high potential power signal may be reduced.

According to the present disclosure, an adjacent scan line is used as a reference line to simplify the circuit structure.

According to the present disclosure, the high potential power line or the low potential power line is configured in a mesh type to lower a resistance and reduce or minimize the voltage drop.

According to the present disclosure, connection lines which extend in accordance with the extension of the stretchable display device are connected in a mesh type so that the defect due to the crack and the disconnection of the connection line may be reduced.

According to the present disclosure, the visibility of a connection line having a specific color to the user may be reduced.

According to the present disclosure, a reflectance is increased to implement a mirror stretchable display device.

According to the present disclosure, an empty space is utilized to increase a reflectance of the stretchable display device.

The effects according to the present disclosure are not limited to the contents exemplified above, and more various effects are included in the present specification.

BRIEF DESCRIPTION OF THE SEVERAL VIEWS OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
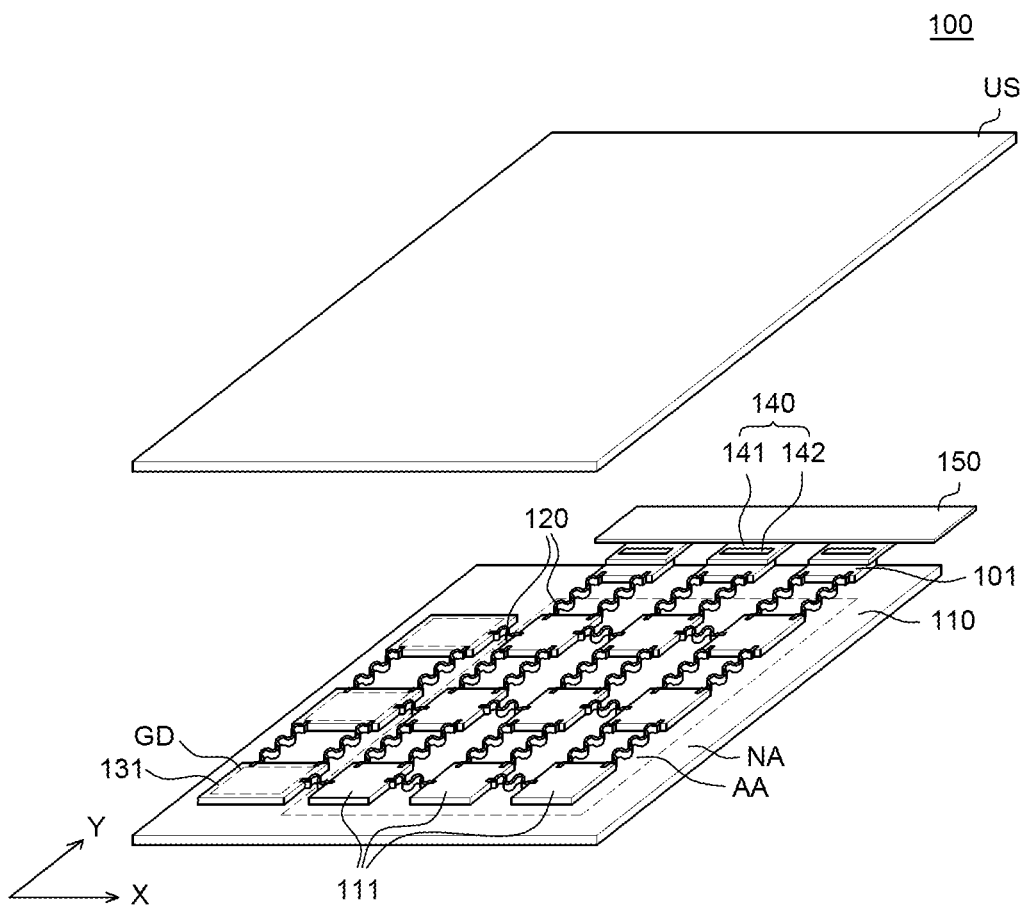
FIG. 1 is an exploded perspective view of a stretchable display device according to an embodiment of the present disclosure.

Advantages and characteristics of the present disclosure and a method of achieving the advantages and characteristics will be clear by referring to embodiments described below in detail together with the accompanying drawings. However, the present disclosure is not limited to the embodiments disclosed herein but will be implemented in various forms. The embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a stretchable display device according to embodiments of the present disclosure will be described in detail with reference to accompanying drawings.

Stretchable Display Device

A stretchable display device may be referred to as a display device which is capable of displaying images even though the display device is bent or extended. The stretchable display device may have a high flexibility as compared with a general display device of the related art. Therefore, a shape of a stretchable display device may be freely changed in accordance with manipulation of a user to bend or extend a stretchable display device. For example, when the user holds ends of the stretchable display device to pull the stretchable display device, the stretchable display device may be extended by the force of the user. Alternatively, when the user disposes the stretchable display device on a wall surface which is not flat, the stretchable display device may be disposed to be bent in accordance with the shape of the surface of the wall surface. Further, when a force applied by the user is removed, the stretchable display device may return to its original shape.

FIG. 1 is an exploded perspective view of a display device according to an embodiment of the present disclosure. Referring to FIG. 1, a stretchable display device 100 includes a lower substrate 110, a plurality of pixel substrates 111 (e.g., includes first pixel substrates 111A, second pixel substrates 111B, third pixel substrates 111C, fourth pixel substrates 111D, etc.), a plurality of connection substrates 120 (e.g., includes at least a first connection substrate 121, at least a second connection substrate 122, etc.), a plurality of peripheral substrates 131, a chip on film (COF) 140, a printed circuit board 150, and an upper substrate US.

The lower substrate 110 is a substrate which supports and protects several components of the stretchable display device 100. The lower substrate 110 which is a soft substrate may be configured by an insulating material which is bendable or stretchable. For example, the lower substrate 110 may be formed of a silicon rubber such as polydimethylsiloxane (PDMS) or an elastomer such as polyurethane (PU) or polytetrafluoroethylene (PTFE) and thus have a flexible property. However, the material of the lower substrate 110 is not limited thereto.

The lower substrate 110 is a soft substrate so as to be reversibly expanded and contracted. Further, an elastic modulus of the lower substrate 110 may be several MPa to several hundreds of MPa, for example, may be 0.5 MPa to 1 MPa. Further, an extension rupture rate of the lower substrate 110 may be 100% or higher. Here, the extension rupture rate refers to an extension rate at a timing when an object to be extended is broken or cracked. A thickness of the lower substrate 110 may be 10 µm to 1 mm, but is not limited thereto.

In the meantime, the lower substrate 110 may have a display area AA and a non-display area NA enclosing the display area AA.

The display area AA is an area in which an image is displayed in the stretchable display device 100 and a display element and various driving elements for driving the display element are disposed in the display area AA. The display area AA includes a plurality of pixels including a plurality of sub pixels. The plurality of sub pixels is disposed in the display area AA and includes a plurality of display elements. The plurality of sub pixels may be connected to various wiring lines, respectively. For example, each of the plurality of sub pixels may be connected to various wiring lines such as a gate line, a data line, a high potential power line, a low potential power line, and a reference line.

The non-display area NA is an area adjacent to the display area AA. The non-display area NA is adjacent to the display area AA to enclose the display area AA. In the non-display area NA, no image is displayed and wiring lines and circuit units may be formed. For example, in the non-display area NA, a plurality of pads may be disposed, and the pads may be connected to the plurality of sub pixels of the display areas AA, respectively.

The plurality of pixel substrates 111 and the plurality of peripheral substrates 131 are disposed on the lower substrate 110. The plurality of pixel substrates 111 may be disposed in the display area AA of the lower substrate 110 and the plurality of peripheral substrates 131 may be disposed in the non-display area NA of the lower substrate 110. In FIG. 1, it is illustrated that the plurality of peripheral substrates 131 is disposed in the non-display area NA at one side of the display area AA in an X-axis direction and is disposed in the non-display area NA at one side of the display area AA in a Y-axis direction. However, the present disclosure is not limited thereto and the plurality of peripheral substrates 131 may be disposed in an arbitrary area of the non-display area NA.

The plurality of pixel substrates 111 and the plurality of peripheral substrates 131 are rigid substrates and are spaced apart from each other to be independently disposed on the lower substrate 110. That is, the plurality of pixel substrates 111 and the plurality of peripheral substrates 131 may also be referred to as rigid substrates or island substrates. The plurality of pixel substrates 111 and the plurality of peripheral substrates 131 may be harder than the lower substrate 110. That is, the lower substrate 110 may have a soft characteristic more than the plurality of pixel substrates 111 and the plurality of peripheral substrates 131 and the plurality of pixel substrates 111 and the plurality of peripheral substrates 131 may have a rigid characteristic more than the lower substrate 110.

The plurality of pixel substrates 111 and the plurality of peripheral substrates 131 which are the plurality of rigid substrates may be formed of a plastic material having flexibility and for example, may be formed of polyimide (PI), polyacrylate, or polyacetate, but is not limited thereto, and may be formed of different materials. In this case, the plurality of pixel substrates 111 and the plurality of peripheral substrates 131 may be formed of the same material or substantially the same material, but are not limited thereto and may be formed of different materials.

Moduli of the plurality of pixel substrates 111 and the plurality of peripheral substrates 131 may be higher than a modulus of the lower substrate 110. The modulus is an elastic modulus which represents a ratio being deformed by a stress with respect to a stress applied to the substrate. The higher the modulus, the higher a degree of hardness. Therefore, the plurality of pixel substrates 111 and the plurality of peripheral substrates 131 may be a plurality of rigid substrates having rigidity as compared with the lower substrate 110. The moduli of the plurality of pixel substrates 111 and the plurality of peripheral substrates 131 may be 1000 times higher than the modulus of the lower substrate 110, but are not limited thereto. For example, an elastic modulus of the pixel substrate 111 may be 2 GPa to 9 GPa depending on the transparency. More specifically, when the pixel substrate 111 is transparent, the elastic modulus may be 2 GPa and when the pixel substrate 111 is opaque, the elastic modulus may be 9 GPa.

In some embodiments, the lower substrate 110 may be defined to include a plurality of first lower patterns and a second lower pattern. The plurality of first lower patterns is disposed in an area of the lower substrate 110 overlapping with the plurality of pixel substrates 111 and the plurality of peripheral substrates 131. The second lower pattern may be disposed in an area excluding an area where the plurality of pixel substrates 111 and the plurality of peripheral substrates 131 are disposed or may be disposed in the entire stretchable display device 100.

In this case, moduli of the plurality of first lower patterns may be higher than modulus of the second lower pattern. For example, the plurality of first lower patterns may be formed of the same material or substantially the same material as the plurality of pixel substrates 111 and the second lower pattern may be formed of a material having a modulus lower than that of the plurality of pixel substrates 111.

The COF 140 is a film on which various components are disposed on a base film 141 having a malleability and supplies signals to the plurality of sub pixels SPX of the display area AA. The COF 140 may be bonded to the plurality of pads disposed in the non-display area NA. The COF 140 may supply a data voltage to each of the plurality of sub pixels SPX of the display area AA through the pad. The COF 140 includes the base film 141 and a driving IC 142. Further, various components may be additionally disposed thereon.

The base film 141 is a layer which supports the driving IC 142 of the COF 140. The base film 141 may be formed of an insulating material, and for example, may be formed of an insulating material having a flexibility.

The driving IC 142 is a component which processes data for displaying images and a driving signal for processing the images. In FIG. 1, even though it is illustrated that the driving IC 142 is mounted in a COF 140 manner, the driving IC 142 may be mounted by a technique such as chip on glass (COG) or tape carrier package (TCP), but it is not limited thereto.

In FIG. 1, one peripheral substrate 131 is disposed in the non-display area NA at one side of the display area AA so as to correspond to one column of pixel substrates 111 disposed in the display area AA and one COF 140 is disposed for one peripheral substrate 131, but is not limited thereto. One peripheral substrate 131 and one COF 140 may be disposed so as to correspond to a plurality of columns of pixel substrates 111.

A control unit such as an IC chip or a circuit unit may be mounted on the printed circuit board 150. Further, on the printed circuit board 150, a memory or a processor may be mounted. The printed circuit board 150 is a component which transmits a signal for driving the display element from the control unit to the display element. Even though in FIG. 1, it is described that one printed circuit boards 150 are used, the number of printed circuit boards 150 is not limited thereto.

Hereinafter, a sub pixel of the stretchable display device 100 according to an embodiment of the present disclosure will be described in more detail with reference to FIGS. 2 and 3.

Driving Circuit of Sub Pixel SPX

Figure 2:
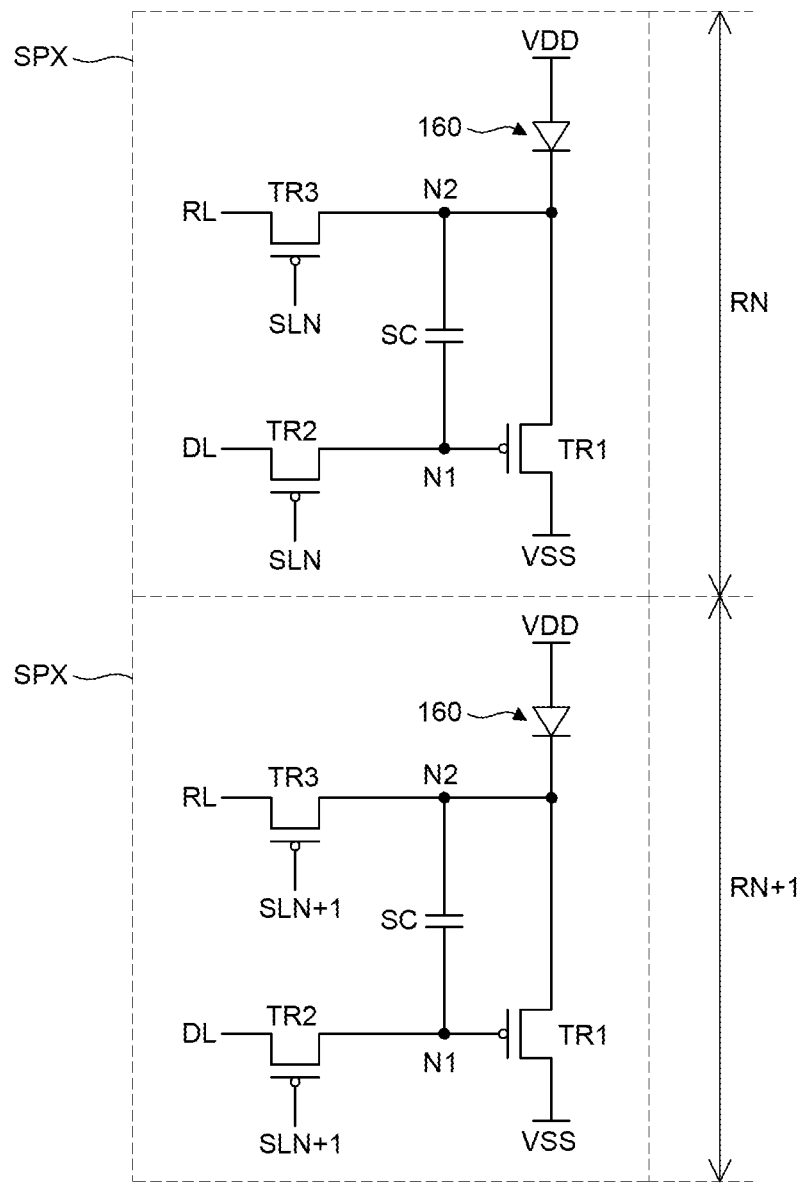
FIG. 2 is a circuit diagram of a plurality of sub pixels of a stretchable display device according to an embodiment of the present disclosure.

FIG. 2 is a circuit diagram of a plurality of sub pixels of a stretchable display device according to an embodiment of the present disclosure. FIG. 3 is a timing diagram according to the circuit diagram of FIG. 2. For the convenience of description, in FIG. 2, a circuit diagram of sub pixels SPX disposed in an N-th row RN and an N+1-th row RN+1 in the same column is illustrated.

Referring to FIG. 2, a driving circuit of each of the plurality of sub pixels SPX includes a first transistor TR1, a second transistor TR2, a third transistor TR3, and a storage capacitor SC. A plurality of wiring lines which supplies various signals to the driving circuit includes a plurality of scan lines SL, a plurality of data lines DL, a plurality of high potential power lines VDD, a plurality of low potential power lines VSS, and a plurality of reference lines RL.

Referring to FIG. 2, each of the first transistor TR1, the second transistor TR2, and the third transistor TR3 included in the driving circuit of each of the plurality of sub pixels SPX includes a gate electrode, a source electrode, and a drain electrode. The first transistor TR1, the second transistor TR2, and the third transistor TR3 may be P-type thin film transistors or N-type thin film transistors. For example, since in the P-type thin film transistor, holes flow from the source electrode to the drain electrode, the current may flow from the source electrode to the drain electrode. Since in the N-type thin film transistor, electrons flow from the source electrode to the drain electrode, the current may flow from the drain electrode to the source electrode. Hereinafter, the description will be made under the assumption that the first transistor TR1, the second transistor TR2, and the third transistor TR3 are P-type thin film transistors in which the current flows from the source electrode to the drain electrode, but the present disclosure is not limited thereto.

The first transistor TR1 includes a first active layer, a first gate electrode, a first source electrode, and a first drain electrode. The first gate electrode is connected to a first node N1, the first source electrode is connected to a cathode of the light emitting diode 160 which is a second node N2, and the first drain electrode is connected to the low potential power line VSS. In this case, a low potential power signal from the low potential power line VSS may be a ground voltage. When a voltage of the first node N1 is higher than a threshold voltage, the first transistor TR1 may be turned on, and when the voltage of the first node N1 is lower than the threshold voltage, the first transistor TR1 may be turned off. The first transistor TR1 may control the current flowing into the light emitting diode 160. The first transistor TR1 may be referred to as a driving transistor.

The second transistor TR2 includes a second active layer, a second gate electrode, a second source electrode, and a second drain electrode. The second gate electrode is connected to one scan line SL among the plurality of scan lines SL, the second source electrode is connected to one data line DL among the plurality of data lines DL, and the second drain electrode is connected to the first node N1. For example, a second gate electrode of a sub pixel SPX in the N-th row RN is connected to an N-th scan line SLN among the plurality of scan lines SL and a second gate electrode of a sub pixel SPX in the N+1-th row RN+1 may be connected to an N+1-th scan line SLN+1 among the plurality of scan lines SL.

In this case, the sub pixel SPX in the N-th row RN and the sub pixel SPX in the N+1-th row RN+1 are disposed in the same column to be electrically connected to one data line DL. In this case, when the second transistor TR2 of the sub pixel SPX in the N-th row RN is turned on, a data signal to be input to the sub pixel SPX in the N-th row RN is transmitted to the data line DL. Further, when the second transistor TR2 of the sub pixel SPX in the N+1-th row RN+1 is turned on, a data signal to be input to the sub pixel SPX in the N+1-th row RN+1 may be transmitted to the data line DL.

The second transistor TR2 may be turned on or off based on a scan signal from the scan line SL. When the second transistor TR2 is turned on, a data signal from the data line DL may be charged in the first node N1. The second transistor TR2 may be referred to as a switching transistor.

The third transistor TR3 includes a third active layer, a third gate electrode, a third source electrode, and a third drain electrode. The third gate electrode is connected to the same scan line SL as the second gate electrode, the third source electrode is connected to the reference line RL, and the third drain electrode is connected to the second node N2. The third transistor TR3 may be turned on or off based on a scan signal from the scan line SL. When the third transistor TR3 is turned on, a high level of reference voltage from the reference line RL may be transmitted to the second node N2. The third transistor TR3 may be referred to as a sensing transistor.

In the meantime, in FIG. 2, it is illustrated that the second gate electrode of the second transistor TR2 and the third gate electrode of the third transistor TR3 are connected to the same scan line SL. However, the second gate electrode of the second transistor TR2 and the third gate electrode of the third transistor TR3 may be connected to different scan lines SL and the present disclosure is not limited thereto.

The storage capacitor SC includes a first capacitor electrode and a second capacitor electrode. The first capacitor electrode is connected to the first node N1 and the second capacitor electrode is connected to the second node N2. The storage capacitor SC stores a potential difference between the first gate electrode and the first source electrode of the first transistor TR1, that is, a gate-source voltage Vgs while the light emitting diode 160 emits light, so that a constant current may be supplied to the light emitting diode 160.

The cathode of the light emitting diode 160 is connected between the second node N2 and the first transistor TR1 and an anode of the light emitting diode 160 is connected to the high potential power line VDD. The light emitting diode 160 is supplied with a current to emit light. The anode of the light emitting diode 160 of each of the plurality of sub pixels SPX is connected to the high potential power line VDD to which a constant high potential power signal is supplied. The cathode of the light emitting diode 160 is connected to the first transistor TR1 supplied with a signal which varies depending on the data signal. Accordingly, the stretchable display device 100 according to the embodiment of the present disclosure may be configured with a common anode structure in which the same signal is supplied to the anode of the light emitting diode 160.

In the meantime, in the present disclosure, a wiring line which transmits a high potential power signal is defined as a high potential power line VDD and a wiring line which transmits a low potential power signal is defined as a low potential power line VSS. However, the high potential power line VDD may also be referred to as a first power line and the low potential power line VSS may also be referred to as a second power line and the present disclosure is not limited thereto.

In the meantime, in FIG. 2, it is described that the driving circuit of the sub pixel SPX of the stretchable display device 100 according to the embodiment of the present disclosure has a 3T1C structure including three transistors TR1, TR2, and TR3 and one storage capacitor SC. However, the number and a connection relationship of the transistors TR1, TR2, and TR3 and the storage capacitor SC may vary in various ways depending on the design and are not limited thereto.

Hereinafter, a driving method of a sub pixel SPX of the stretchable display device 100 according to the embodiment of the present disclosure will be described with reference to FIG. 3 together.

Figure 3:
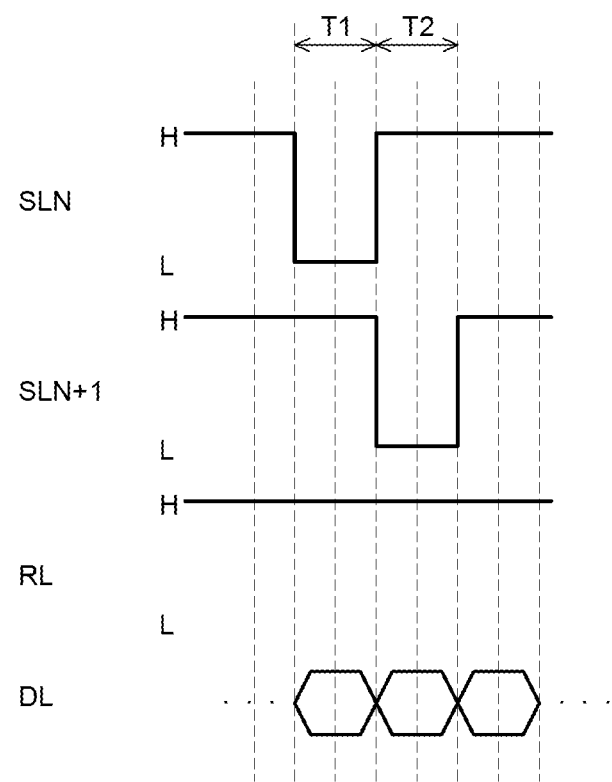
FIG. 3 is a timing diagram according to the circuit diagram of FIG. 2.

Referring to FIGS. 2 and 3 together, a scan signal is supplied from the N-th scan line SLN for one period T1. The first period T1 is a period when the second node N2 of the sub pixel SPX in the N-th row RN is initialized and a data signal is input to the sub pixel SPX in the N-th row RN.

In the meantime, in the P-type transistor, a low level is a turn-on voltage and a high level is a turn-off voltage. Therefore, a low level of scan signal is supplied, the second transistor TR2 and the third transistor TR3 may be turned on.

When the low level of scan signal is supplied to the N-th scan line SLN during the first period T1, the second transistor TR2 and the third transistor TR3 of the sub pixel SPX in the N-th row RN connected to the N-th scan line SLN may be simultaneously turned on.

When the second transistor TR2 is turned on, the data signal from the data line DL may be supplied to the first node N1 through the second source electrode and the second drain electrode of the second transistor TR2. Therefore, during the first period T1, a potential of the first node N1 is charged with the data signal, that is, the first node N1 may have the same potential as the data signal.

When the third transistor TR3 is turned on, the reference signal from the reference line RL may be supplied to the second node N2 through the third source electrode and the third drain electrode of the third transistor TR3. Therefore, during the first period T1, a potential of the second node N2 is initialized with a reference signal, that is, the second node N2 may have the same potential as the reference signal.

In the meantime, the first gate electrode of the first transistor TR1 is connected to the first capacitor electrode of the storage capacitor SC at the first node N1. The first source electrode of the first transistor TR1 is connected to the second capacitor electrode of the storage capacitor SC at the second node N2. Therefore, the data signal which is transmitted via the second transistor TR2 and the first node N1 from the data line DL becomes a voltage of the first gate electrode of the first transistor TR1. The reference signal transmitted via the third transistor TR3 and the second node N2 from the reference line RL becomes a voltage of the first source electrode of the first transistor TR1. In this case, the storage capacitor SC is connected to the first gate electrode and the first source electrode of the first transistor TR1 to store a voltage difference between the first gate electrode and the first source electrode so that a voltage difference between the data signal and the reference signal may be stored in the storage capacitor SC.

Next, during a second period T2, a high level of scan signal is supplied to the N-th scan line SLN, rather than a low level of scan signal. During a second period T2, the low level of scan signal is supplied to the N+1-th scan line SLN+1. The second period T2 is a period when a light emitting diode 160 of the sub pixel SPX of the N-th row RN emits light. Further, the second period T2 is a period when the second node N2 of the sub pixel SPX in the N+1-th row RN+1 is initialized and a data signal is input to the sub pixel SPX in the N+1-th row RN+1.

The low level of scan signal is not supplied to the N-th scan line SLN during the second period T2 so that the second transistor TR2 and the third transistor TR3 of the sub pixel SPX in the N-th row RN may be simultaneously turned off.

Even after the second transistor TR2 and the third transistor TR3 of the sub pixel SPX in the N-th row RN are turned off, the first node N1 and the second node N2 may maintain a constant voltage by the storage capacitor SC. Therefore, the voltage difference between the first gate electrode and the first source electrode of the first transistor TR1 is maintained by a capacitance stored in the storage capacitor SC so that the first transistor TR1 may be maintained to be turned on.

Further, during the second period T2 when the first transistor TR1 of the sub pixel SPX of the N-th row RN is turned on, the current may flow along the light emitting diode 160. Accordingly, during the second period T2, the first transistor TR1 of the sub pixel SPX of the N-th row RN is turned on and the light emitting diode 160 may emit light.

During the second period T2, a low level of scan signal is supplied to the N+1-th scan line SLN+1. When the scan signal is supplied, the second transistor TR2 and the third transistor TR3 of the sub pixel SPX of the N+1-th row RN+1 connected to the N+1-th scan line SLN+1 may be simultaneously turned on.

The second transistor TR2 of the sub pixel SPX of the N+1-th row RN+1 is turned on to supply the data signal to the first node N1, and the third transistor TR3 is turned on to supply the reference signal to the second node N2. Accordingly, a voltage difference between the first gate electrode and the first source electrode of the first transistor TR1, that is, the voltage difference between the data signal and the reference signal may be stored in the storage capacitor SC of the sub pixel SPX of the N+1-th row RN+1.

Accordingly, during the second period T2, the light emitting diode 160 of the sub pixel SPX of the N-th row RN emits light, the sub pixel SPX of the N+1-th row RN+1 initializes the second node N2 with the reference signal, and the voltage difference between the reference signal and the data signal may be stored in the storage capacitor SC, simultaneously.

In the stretchable display device 100 according to the embodiment of the present disclosure, the anode of the light emitting diode 160 is connected to the high potential power line VDD and the cathode is connected to the first transistor TR1. That is, in the stretchable display device 100 according to the embodiment of the present disclosure, a constant high potential power signal is supplied from the high potential power line VDD to the anode of the light emitting diode 160, and different signals may be supplied to the cathode at every frame in accordance with the data signal. Accordingly, in the stretchable display device 100 according to the embodiment of the present disclosure, the driving circuit of the sub pixels SPX may be formed with a common anode structure.

In the case of the display device of the related art which used an organic light emitting diode as a light emitting diode, the display device was manufactured by sequentially laminating an anode, an organic light emitting layer, and a cathode of the organic light emitting diode. In this case, the anodes are patterned for every sub pixel to be spaced apart from each other, and the cathode is commonly formed on the entire surface of the display device. Therefore, the low potential power signal is commonly input to the cathode and different signals are input to the plurality of anodes depending on the data signal. That is, the organic light emitting display device of the related art may be configured with a common cathode structure. However, in the common cathode structure, the high potential power line is directly connected to the source electrode of the driving transistor so that the high potential power signal is transmitted to the node between the source electrode of the driving transistor and the storage capacitor.

In the meantime, the high potential power signal transmitted along the high potential power line VDD may be dropped due to the resistance so that there is a deviation of high potential power signal transmitted to each of the plurality of sub pixels SPX. In this case, in the display device of the related art in which the high potential power line, the source electrode of the driving transistor, and the storage capacitor are connected to one node, a fluctuation of the gate-source voltage Vgs of the driving transistor stored in the storage capacitor may be caused due to the voltage drop of the high potential power signal. Therefore, in the common cathode structure of the related art, the luminance was not uniform and the image quality was degraded due to the influence of the voltage drop of the high potential power signal.

In order to remove the influence caused by the voltage drop of the high potential power signal, in the related art, a node to which the driving transistor, the storage capacitor, and the high potential power line were connected was initialized with a specific voltage, for example, a reference signal. However, since a current which flowed into the high potential power line was relatively higher than the other signal, even though the node was initialized with the reference signal, there was still a problem in that the potential of the node was fluctuated due to the influence of the high potential power signal again.

Therefore, in the stretchable display device 100 according to the embodiment of the present disclosure, each of the sub pixels SPX is implemented with a common anode structure. Therefore, fluctuation of the potential of the second node N2 to which the first source electrode of the first transistor TR1 which is a driving transistor and the storage capacitor SC are connected, in accordance with the high potential power signal, may be reduced. Specifically, the anode of the light emitting diode 160 is connected to the high potential power line VDD and the cathode is connected to the first transistor TR1. In this case, the high potential power signal from the high potential power line VDD is not directly transmitted to the second node N2, but may be transmitted to the second node N2 between the first transistor TR1 and the storage capacitor SC via the light emitting diode 160. Therefore, the potential of the second node N2 may be easily controlled regardless of the voltage drop of the high potential power signal. Accordingly, in the stretchable display device 100 according to the embodiment of the present disclosure, the fluctuation of the potential of the second node N2 between the first transistor TR1 and the storage capacitor SC due to the voltage drop of the high potential power signal may be reduced. As a result, the luminance uniformity and the image quality may be improved.

In the meantime, in the case of the organic light emitting diode of the related art, even though the cathode was formed on the entire surface of the display device as described above, the cathode needed to be patterned to implement the common anode structure, which caused a difficulty in the process. In contrast, in the stretchable display device 100 according to the embodiment of the present disclosure, the light emitting diode 160 is configured by the LED so that the common anode structure may be easily implemented.

Hereinafter, a structure of a sub pixel SPX of the stretchable display device 100 according to the embodiment of the present disclosure will be described in detail with reference to FIGS. 4 and 5.

Planar and Cross-Sectional Structures

Figure 4:
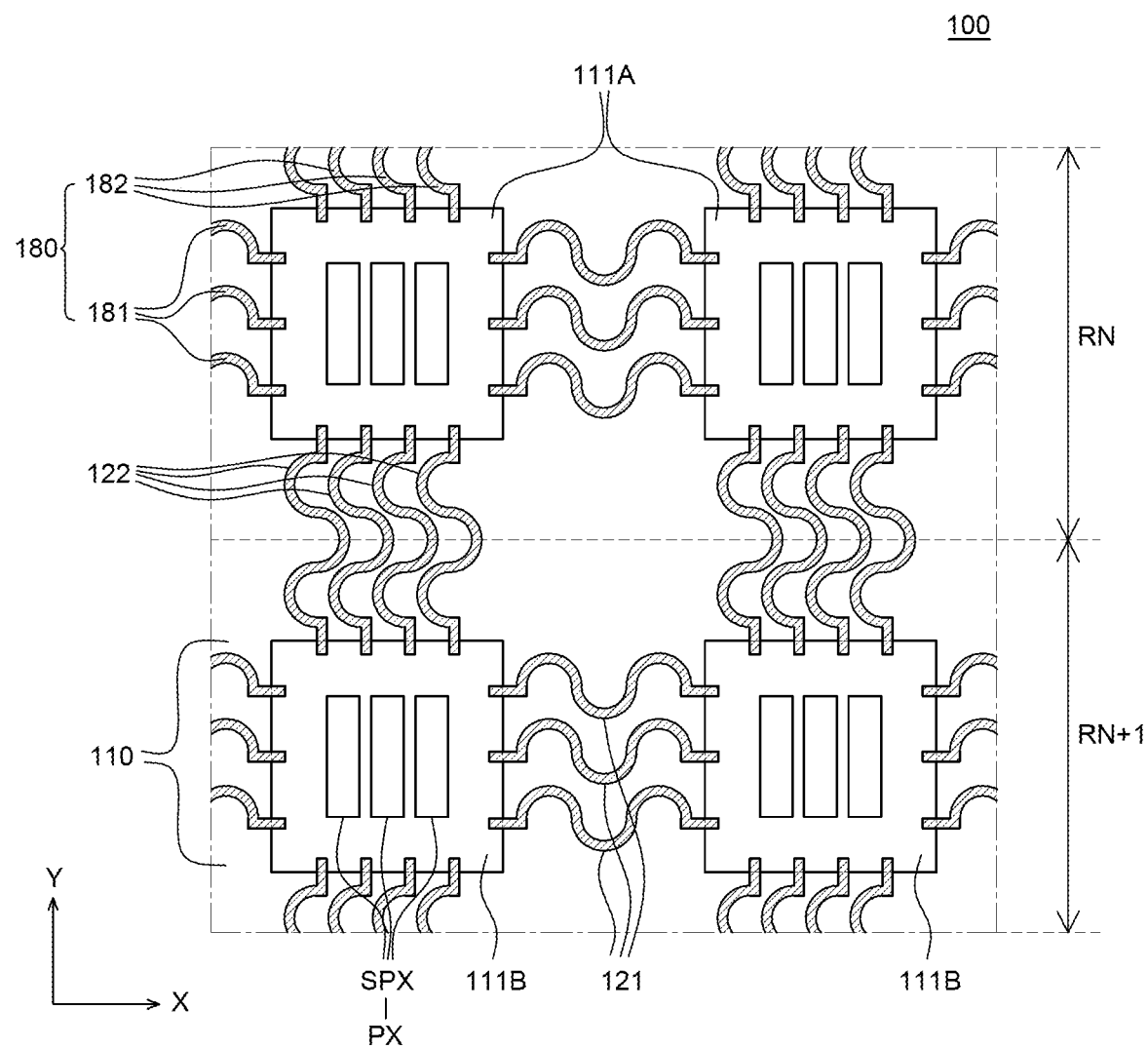
FIG. 4 is an enlarged plan view of a stretchable display device according to an embodiment of the present disclosure.

FIG. 4 is an enlarged plan view of a stretchable display device according to an embodiment of the present disclosure. FIG. 5 is a schematic cross-sectional view of one sub pixel of FIG. 4. For the convenience of description, the description will be made also with reference to FIGS. 1 to 3.

Referring to FIGS. 1 and 4, the plurality of pixel substrates 111 is disposed on the lower substrate 110 in the display area AA. A plurality of sub pixels SPX which configures the pixel PX may be disposed in each of the plurality of pixel substrates 111. The plurality of pixel substrates 111 is spaced apart from each other to be disposed on the lower substrate 110. For example, as illustrated in FIGS. 1 and 4, the plurality of pixel substrates 111 may be disposed on the lower substrate 110 in a matrix to form a plurality of rows and a plurality of columns, but is not limited thereto.

The plurality of pixel substrates 111 includes a first pixel substrate 111A and a second pixel substrate 111B. The first pixel substrate 111A is disposed in the N-th row RN among the plurality of rows and the second pixel substrate 111B is disposed in the N+1-th row RN+1 among the plurality of rows. Therefore, the first pixel substrates 111A and the second pixel substrates 111B may be alternately disposed in the unit of rows, on the lower substrate 110.

The plurality of peripheral substrates 131 is disposed on the lower substrate 110 in the non-display area NA. The plurality of peripheral substrates 131 is substrates on which a driving circuit such as a gate driver GD and a plurality of pads to which the COF 140 is bonded are disposed. For example, the plurality of pads to which the COF 140 is bonded may be disposed in a peripheral substrate 131 located at one side of the display area AA in the Y-axis direction, among the plurality of peripheral substrates 131.

For example, the gate driver GD may be mounted in a peripheral substrate 131 located at one side of the display area AA in the X-axis direction, among the plurality of peripheral substrates 131. The gate driver GD may be formed on the peripheral substrate 131 in a gate in panel (GIP) manner when various elements on the pixel substrate 111 are manufactured. Therefore, various circuit configurations which configure the gate driver GD, such as transistors, capacitors, and wiring lines may be disposed on the plurality of peripheral substrates 131. However, it is not limited thereto and the gate driver GD may also be mounted in a chip on film (COF) manner. The plurality of peripheral substrates 131 is further disposed in the non-display area NA on both sides of the display area AA in the X-axis direction so that the gate driver GD may be mounted on both sides of the display area AA, but is not limited thereto.

Referring to FIG. 1, a size of the plurality of peripheral substrates 131 may be larger than a size of the plurality of pixel substrates 111. Specifically, a size of each of the plurality of peripheral substrates 131 may be larger than a size of each of the plurality of pixel substrates 111. As described above, on each of the plurality of peripheral substrates 131, the gate driver GD is disposed. For example, one stage of the gate driver GD may be disposed on each of the plurality of peripheral substrates 131. Therefore, an area occupied by various circuit configurations which configure one stage of the gate driver GD may be relatively larger than an area of the pixel substrate 111 on which the pixel PX is disposed. As a result, a size of each of the plurality of peripheral substrates 131 may be larger than a size of each of the plurality of pixel substrates 111. However, the size of the plurality of peripheral substrates 131 may be equal to the size of the plurality of pixel substrates 111, but is not limited thereto.

Referring to FIGS. 1 and 4, the plurality of connection substrates 120 is disposed between the plurality of pixel substrates 111, between the plurality of peripheral substrates 131, or between the plurality of pixel substrates 111 and the plurality of peripheral substrates 131. The plurality of connection substrates 120 is substrates which connect adjacent pixel substrates 111, adjacent peripheral substrates 131, or between the pixel substrates 111 and the peripheral substrates 131. The plurality of connection substrates 120 may be simultaneously and integrally formed with the same material or substantially the same material as the pixel substrates 111 or the peripheral substrate 131, but is not limited thereto.

Referring to FIG. 4, the plurality of connection substrates 120 has a wavy shape. For example, as illustrated in FIG. 4, the plurality of connection substrates 120 may have a sine wave shape. However, the shape of the plurality of connection substrates 120 is not limited thereto. For example, the plurality of connection substrates 120 may have various shapes which extend in a zigzag pattern or extend by connecting a plurality of rhombus shaped substrates at vertexes. Further, the number and the shape of the plurality of connection substrates 120 illustrated in FIG. 4 are illustrative and the number and the shape of the plurality of connection substrates 120 may vary depending on the design.

The plurality of connection substrates 120 includes a first connection substrate 121 and a second connection substrate 122. The first connection substrate 121 may extend in a row direction, that is, in the X-axis direction, between the plurality of pixel substrates 111. The second connection substrate 122 may extend in a column direction, that is, in the Y-axis direction between the plurality of pixel substrates 111. The first connection substrate 121 connects a plurality of first pixel substrates 111A disposed in the N-th row RN to each other and connects a plurality of second pixel substrates 111B disposed in the N+1-th row RN+1 to each other. The second connection substrate 122 is disposed in the same row to connect the first pixel substrate 111A and the second pixel substrate 111B which are adjacent to each other in the Y-axis direction.

Figure 5:
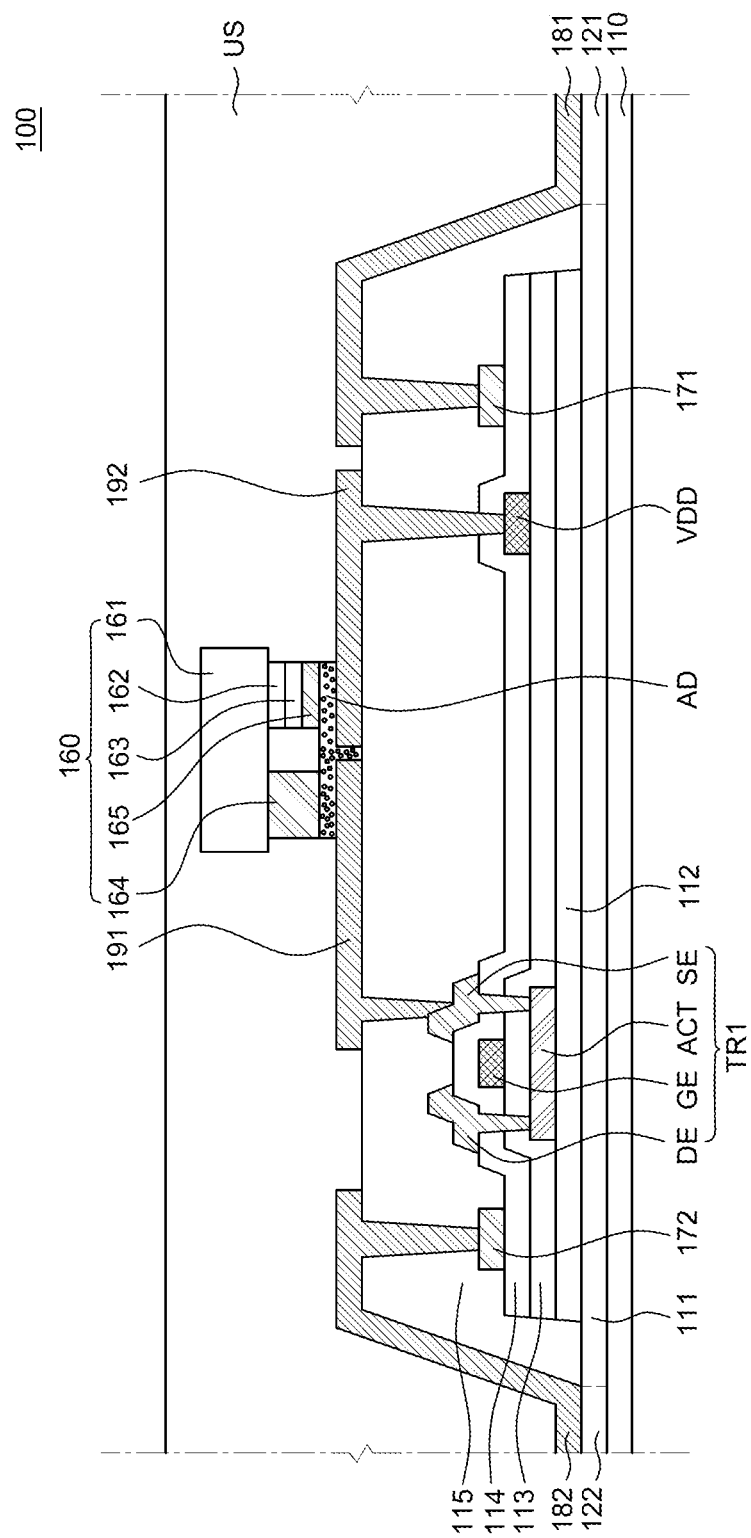
FIG. 5 is a schematic cross-sectional view of one sub pixel of FIG. 4.

Referring to FIGS. 4 and 5 together, a plurality of inorganic insulating layers is disposed on the plurality of pixel substrates 111. For example, the plurality of inorganic insulating layers may include a buffer layer 112, a gate insulating layer 113, and an interlayer insulating layer 114. However, various inorganic insulating layers may be additionally disposed on the plurality of pixel substrates 111 or one or more of the buffer layer 112, the gate insulating layer 113, and the interlayer insulating layer 114 may be omitted, but is not limited thereto.

Referring to FIG. 5, the buffer layer 112 is disposed on the plurality of pixel substrates 111. The buffer layer 112 is formed on the plurality of pixel substrates 111 to protect various components of the stretchable display device 100 from moisture and oxygen permeating from the outside of the lower substrate 110 and the plurality of pixel substrates 111. The buffer layer 112 may be configured by an insulating material and for example, configured by a single layer or a double layer of an inorganic layer formed of silicon nitride (SiNx), silicon oxide (SiOx), and silicon oxynitride (SiON). However, the buffer layer 112 may be omitted depending on a structure or a characteristic of the stretchable display device 100.

In the meantime, the buffer layer 112 may be formed only in an area overlapping with the plurality of pixel substrates 111 and the plurality of peripheral substrates 131. As described above, the buffer layer 112 may be formed of an inorganic material so that the buffer layer 112 may be easily cracked or damaged during a process of extending the stretchable display device 100. Therefore, the buffer layer 112 is not formed in an area between the plurality of pixel substrates 111 and the plurality of peripheral substrates 131, but may be formed only above the plurality of pixel substrates 111 and the plurality of peripheral substrates 131. Therefore, in the stretchable display device 100 according to the embodiment of the present disclosure, the buffer layer 112 is formed only in an area overlapping with the plurality of pixel substrates 111 and the plurality of peripheral substrates 131 which are rigid substrates. Therefore, even though the stretchable display device 100 is bent or stretched to be deformed, the damage of the buffer layer 112 may be suppressed.

Referring to FIG. 5, a first transistor TR1 including a first active layer ACT, a first gate electrode GE, a first source electrode SE, and a first drain electrode DE is disposed on the buffer layer 112.

The first active layer ACT is disposed on the buffer layer 112. For example, the first active layer ACT may be formed of an oxide semiconductor or amorphous silicon (a-Si), polycrystalline silicon (poly-Si), or an organic semiconductor, but is not limited thereto.

The gate insulating layer 113 is disposed on the first active layer ACT. The gate insulating layer 113 is a layer for electrically insulating the first gate electrode GE from the first active layer ACT and may be formed of an insulating material. For example, the gate insulating layer 113 may be configured by a single layer of silicon nitride (SiNx) or silicon oxide (SiOx) which is an inorganic material or a multi-layer of silicon nitride (SiNx) or silicon oxide (SiOx), but it is not limited thereto.

The first gate electrode GE is disposed on the gate insulating layer 113. The first gate electrode GE is disposed to overlap with the first active layer ACT. The first gate electrode GE may be any one of various metal materials, for example, any one of molybdenum (Mo), aluminum (Al), chrome (Cr), gold (Au), titanium (Ti), nickel (Ni), neodymium (Nd), and copper (Cu) or an alloy of two or more of them, or a multi-layer thereof, but it is not limited thereto.

An interlayer insulating layer 114 is disposed on the first gate electrode GE. The interlayer insulating layer 114 is a layer which insulates the first gate electrode GE from the first source electrode SE and the first drain electrode DE and may be formed of an inorganic material, similarly to the buffer layer 112. For example, the interlayer insulating layer 114 may be configured by a single layer of silicon nitride (SiNx) or silicon oxide (SiOx) which is an inorganic material or a multi-layer of silicon nitride (SiNx) or silicon oxide (SiOx), but it is not limited thereto.

The first source electrode SE and the first drain electrode DE which are in contact with the first active layer ACT are disposed on the interlayer insulating layer 114. The first source electrode SE and the first drain electrode DE are disposed on the same layer to be spaced apart from each other. The first source electrode SE and the first drain electrode DE may be in contact with the first active layer ACT to be electrically connected to the first active layer ACT. The first source electrode SE and the first drain electrode DE may be any one of various metal materials, for example, any one of molybdenum (Mo), aluminum (Al), chrome (Cr), gold (Au), titanium (Ti), nickel (Ni), neodymium (Nd), and copper (Cu) or an alloy of two or more of them, or a multi-layer thereof, but it is not limited thereto.

The gate insulating layer 113 and the interlayer insulating layer 114 are patterned to be formed only in an area overlapping with the plurality of pixel substrates 111, similarly to the buffer layer 112. The gate insulating layer 113 and the interlayer insulating layer 114 are also formed of the inorganic material, which is the same as the buffer layer 112 so that the gate insulating layer 113 and the interlayer insulating layer 114 may also be easily cracked to be damaged during the process of stretching the stretchable display device 100. Therefore, the gate insulating layer 113 and the interlayer insulating layer 114 are not formed in an area between the plurality of pixel substrates 111, but may be formed only above the plurality of pixel substrates 111 and the plurality of peripheral substrates 131.

In the meantime, for the convenience of description, only the first transistor TR1 among the first transistor TR1, the second transistor TR2, the third transistor TR3, and the storage capacitor SC of the stretchable display device 100 is illustrated. Further, in the present disclosure, it is described that the first transistor TR1 has a coplanar structure, but the first transistor may be configured to have a staggered structure and it is not limited thereto.

Referring to FIG. 5, a plurality of pads is disposed on the interlayer insulating layer 114. Specifically, a gate pad 171 among the plurality of pads is disposed on the interlayer insulating layer 114. The gate pad 171 is a pad which transmits a scan signal to the plurality of sub pixels SPX. For example, the scan signal is transmitted to a scan line SL disposed on the pixel substrate 111 through the gate pad 171 to turn on or off the second transistor TR2 and the third transistor TR3. The gate pad 171 may be formed of the same material or substantially the same material as the first source electrode SE and the first drain electrode DE, but is not limited thereto.

Referring to FIG. 5, a data pad 172 among the plurality of pads is disposed on the interlayer insulating layer 114. The data pad 172 is a pad which transmits a data signal to the plurality of sub pixels SPX. For example, the data signal is transmitted to the data line DL formed on the pixel substrate 111 through the data pad 172 to be supplied to the second source electrode of the second transistor TR2. The data pad 172 may be formed of the same material or substantially the same material as the first source electrode SE and the first drain electrode DE, but is not limited thereto.

Referring to FIG. 5, a planarization layer 115 is formed on the first transistor TR1 and the interlayer insulating layer 114. The planarization layer 115 flattens an upper portion of the first transistor TR1. The planarization layer 115 may be configured by a single layer or a plurality of layers and may be formed of an organic material. Therefore, the planarization layer 115 may also be referred to as an organic insulating layer. For example, the planarization layer 115 may be formed of an acrylic-based organic material, but is not limited thereto.

The planarization layer 115 is disposed on the plurality of pixel substrates 111 to cover top surfaces and side surfaces of the buffer layer 112, the gate insulating layer 113, and the interlayer insulating layer 114. The planarization layer 115 may be disposed to enclose the buffer layer 112, the gate insulating layer 113, and the interlayer insulating layer 114 together with the plurality of pixel substrates 111. Specifically, the planarization layer 115 may be disposed so as to cover a top surface and a side surface of the interlayer insulating layer 114, a side surface of the gate insulating layer 113, a side surface of the buffer layer 112, and a part of a top surface of the plurality of pixel substrates 111. Therefore, the planarization layer 115 may supplement a step on the side surfaces of the buffer layer 112, the gate insulating layer 113, and the interlayer insulating layer 114 and enhance an adhesive strength of the planarization layer 115 and the connection line 180 disposed on the side surface of the planarization layer 115.

An inclination angle of the side surface of the planarization layer 115 may be smaller than an inclination angle formed by side surfaces of the buffer layer 112, the gate insulating layer 113, and the interlayer insulating layer 114. For example, the side surface of the planarization layer 115 may have a slope which is gentler than a slope formed by a side surface of the interlayer insulating layer 114, a side surface of the gate insulating layer 113, and a side surface of the buffer layer 112. The connection line 180 which is in contact with the side surface of the planarization layer 115 may be disposed with a gentle slope. Accordingly, when the stretchable display device 100 extends, the stress generated in the connection line 180 is reduced and the crack of the connection line 180 or the separation of the connection line 180 from the side surface of the planarization layer 115 may be suppressed.

In some embodiments, a passivation layer may be further formed between the first transistor TR1 and the planarization layer 115. That is, the passivation layer may be formed to cover the first transistor TR1 to protect the first transistor TR1 from the permeation of the moisture and oxygen. The passivation layer may be formed of an inorganic material and configured by a single layer or a plurality of layers, but is not limited thereto.

The high potential power line VDD is disposed on the gate insulating layer 113. The high potential power line VDD is a wiring line which applies the high potential power signal to the plurality of sub pixels SPX. The high potential power line VDD may be formed of the same material or substantially the same material as the first gate electrode GE of the first transistor TR1, but is not limited thereto.

Referring to FIGS. 4 and 5, the connection line 180 is disposed on the pixel substrate 111 and the plurality of connection substrates 120. The connection line 180 refers to a wiring line which electrically connects pads on the plurality of pixel substrates 111 or the plurality of peripheral substrates 131.

The connection lines 180 include a first connection line 181 and a second connection line 182. The first connection line 181 and the second connection line 182 are disposed between the plurality of pixel substrates 111. Specifically, the first connection line 181 refers to a wiring line extending in the X-axis direction between the plurality of pixel substrates 111, among the connection lines 180. The second connection line 182 refers to a wiring line extending in the Y-axis direction between the plurality of pixel substrates 111, among the connection lines 180. For example, the first connection line 181 is disposed on the first connection substrate 121 among the plurality of connection substrates 120. The second connection line 182 may be disposed on the second connection substrate 122.

The connection line 180 may be formed of a metal material such as copper (Cu), aluminum (Al), titanium (Ti), and molybdenum or a stacked structure of metal materials such as copper/molybdenum-titanium (Cu/Moti) or titanium/aluminum/titanium (Ti/Al/Ti), but is not limited thereto.

In the case of a general display device, various wiring lines such as a plurality of scan lines and a plurality of data lines extend between the plurality of sub pixels with a straight line shape and the plurality of sub pixels is connected to one signal line. Therefore, in the general display device, various wiring lines such as a scan line, a data line, a high potential power line, a low potential power line, and a reference line extending from one side to the other side of the organic light emitting display device without being disconnected on the substrate.

In contrast, in the stretchable display device 100 according to the embodiment of the present disclosure, various wiring lines such as a scan line SL, a data line DL, a high potential power line VDD, a low potential power line VSS, or a reference line RL having a straight line shape which are considered to be used for the general display device may be disposed only on the plurality of pixel substrates 111 and the plurality of peripheral substrates 131. That is, in the stretchable display device 100 according to the embodiment of the present disclosure, a straight wiring line is disposed only on the plurality of pixel substrates 111 and the plurality of peripheral substrates 131.

In the stretchable display device 100 according to the embodiment of the present disclosure, in order to connect discontinuous wiring lines on the pixel substrate 111 or the peripheral substrate 131, pads on two adjacent pixel substrates 111 or two adjacent peripheral substrates 131 may be connected by the connection line 180. That is, the connection line 180 electrically connects the pads on adjacent pixel substrates 111, adjacent peripheral substrates 131, and the pixel substrate 111 and the peripheral substrate 131 which are adjacent. Accordingly, the stretchable display device 100 according to the embodiment of the present disclosure may include a plurality of connection lines 180 to electrically connect various wiring lines, such as a scan line SL, a data line DL, a high potential power line VDD, a low potential power line VSS, or a reference line RL, between the plurality of pixel substrates 111, between the plurality of peripheral substrates 131, and between the plurality of pixel substrates 111 and the plurality of peripheral substrates 131. For example, the scan line SL may be disposed above the plurality of pixel substrates 111 disposed to be adjacent to each other in the X-axis direction and the gate pad 171 may be disposed on both ends of the scan line SL. In this case, the plurality of gate pads 171 on the plurality of pixel substrates 111 adjacent to each other in the X-axis direction may be connected to each other by the first connection line 181 which serves as a scan line SL. Therefore, the scan line SL disposed on the plurality of pixel substrates 111 and the first connection line 181 disposed on the connection substrate 120 may serve as one scan line SL. Further, wiring lines which extend in the X-axis direction, among all various wiring lines which may be included in the stretchable display device 100, such as a low potential power line VSS and a high potential power line VDD, may also be electrically connected by the first connection line 181, as described above.

Referring to FIGS. 4 and 5, the plurality of first connection lines 181 may connect pads on two pixel substrates 111 which are disposed side by side, among the pads on the plurality of pixel substrates 111 which is disposed to be adjacent to each other in the X-axis direction. For example, the plurality of first connection lines 181 may electrically connect pads on one pair of first pixel substrates 111A which are disposed in the same row to be adjacent to each other in the X-axis direction. Further, the plurality of first connection lines 181 may electrically connect pads on one pair of second pixel substrates 111B which are disposed in the same row to be adjacent to each other in the X-axis direction.

The plurality of first connection lines 181 may serve as a scan line SL, a high potential power line VDD, and a low potential power line VSS, but is not limited thereto. For example, one first connection line 181 among the plurality of first connection lines 181 may serve as a scan line SL and electrically connect the gate pads 171 on two pixel substrates 111 which are disposed side by side in the X-axis direction. Therefore, as described above, the gate pads 171 on the plurality of pixel substrates 111 disposed in the same row may be connected by one first connection line 181 serving as a scan line SL and transmit one scan signal.

Further, the other first connection line 181 among the plurality of first connection lines 181 may serve as a low potential power line VSS and electrically connect the pads 171 on two pixel substrates 111 which are disposed side by side in the X-axis direction. The remaining first connection line 181 among the plurality of first connection lines 181 may serve as a high potential power line VDD and electrically connect the pads on two pixel substrates 111 which are disposed side by side in the X-axis direction.

Referring to FIG. 4, the plurality of second connection lines 182 may connect pads on two pixel substrates 111 which are disposed side by side among the pads on the plurality of pixel substrates 111 which is disposed to be adjacent to each other in the Y-axis direction. For example, the plurality of second connection lines 182 may electrically connect pads on the first pixel substrate 111A and the second pixel substrate 111B which are disposed in the same row to be adjacent to each other in the Y-axis direction.

The plurality of second connection lines 182 may serve as a data line DL and a reference line RL, but is not limited thereto. For example, some second connection lines 182 among the plurality of second connection lines 182 may serve as data lines DL which transmit a red data signal, a blue data signal, and a green data signal and electrically connect data lines DL on two pixel substrates 111 which are disposed side by side in the Y-axis direction. Therefore, as described above, the data lines DL on the plurality of pixel substrates may be connected by the plurality of second connection lines 182 which serves as data lines DL and one data signal may be transmitted.

Further, the remaining second connection line 182 among the plurality of second connection lines 182 may serve as a reference line RL and electrically connect the pads on two pixel substrates 111 which are disposed side by side in the Y-axis direction.

Referring to FIG. 1, the plurality of connection lines 180 may further include a wiring line which connects pads on the plurality of pixel substrates 111 and the plurality of peripheral substrates 131 or connects pads on two peripheral substrates 131 disposed side by side, among pads on the plurality of peripheral substrates 131 disposed to be adjacent to each other in the Y-axis direction.

The first connection line 181 may be formed to extend to a top surface of the first connection substrate 121 while being in contact with a top surface and a side surface of the planarization layer 115 disposed on the pixel substrate 111. Further, the second connection line 182 may be formed to extend to a top surface of the second connection substrate 122 while being in contact with a top surface and a side surface of the planarization layer 115 disposed on the pixel substrate 111.

In the meantime, in FIG. 5, it is illustrated that the connection line 180 is connected to the gate pad 171 and the data pad 172 below the planarization layer 115 through a contact hole formed in the planarization layer 115. That is, it is illustrated that the connection line 180 is electrically connected to components on the pixel substrate 111 in a jumping manner. However, the present disclosure is not limited thereto and the connection line 180 extends in a straight line on one plane surface on the pixel substrate 111 to serve as a plurality of wiring lines or pads. For example, the first connection line 181 which transmits the high potential power signal, among the plurality of connection lines 180 may extend in a straight line to cross the entire top surface of the planarization layer 115 without being connected to the other components, in a jumping manner. A part of the first connection line 181 disposed on the top surface of the planarization layer 115 may serve as a high potential power line VDD. That is, the first connection line 181 and the high potential power line VDD are not separated, but may be integrally formed.

Further, in FIG. 5, it is illustrated that the high potential power line VDD is disposed below the planarization layer 115 and the interlayer insulating layer 114 and a second connection pad 192 which is connected to the high potential power line VDD is disposed on the planarization layer 115. However, the present disclosure is not limited thereto and as described above, when the first connection line 181 which serves as a high potential power line VDD is disposed across the entire top surface of the planarization layer 115, the p-electrode 165 of the light emitting diode 160 may be bonded immediately onto the first connection line 181 which serves as a high potential power line VDD. Therefore, the first connection line 181 itself which extends onto the top surface of the planarization layer 115 to be integrally formed with the high potential power line VDD may serve as a second connection pad 192. Accordingly, a lamination relationship of the plurality of wiring lines, the plurality of pads, and the connection line 180 on the pixel substrate 111 may vary depending on the design, so that it is not limited to that illustrated in the drawings.

In the meantime, even though it is not illustrated in the drawing, a bank may be further disposed on a first connection pad 191, a second connection pad 192, the connection line 180, and the planarization layer 115. The bank is a component which divides the adjacent sub pixels SPX and may be disposed to cover an area on the pixel substrate 111 other than an area where the light emitting diode 160 is disposed. The bank may be formed of an insulating material and when the bank further includes a black material, may block wiring lines which may be visible through the display area AA.

Referring to FIG. 5, the light emitting diode 160 is disposed on the first connection pad 191 and the second connection pad 192. The light emitting diode 160 includes an n-type layer 161, an active layer 162, a p-type layer 163, an n-electrode 164, and a p-electrode 165. The light emitting diode 160 of the stretchable display device 100 according to the embodiment of the present disclosure may be configured by an LED with a flip-chip structure in which the n-electrode 164 and the p-electrode 165 are formed on one surface.

The n-type layer 161 may be formed by injecting an n-type impurity into gallium nitride (GaN) having excellent crystallinity. The n-type layer 161 may be disposed on a separate base substrate which is formed of a material which is capable of emitting light. The p-type layer 163 is disposed on the active layer 162. The p-type layer 163 may be formed by injecting a p-type impurity into gallium nitride (GaN).

The active layer 162 is disposed on the n-type layer 161. The active layer 162 is a light emitting layer which emits light in the light emitting diode 160 and may be formed of a nitride semiconductor, for example, indium gallium nitride (InGaN).

As described above, the light emitting diode 160 according to the embodiment of the present disclosure is manufactured by sequentially laminating the n-type layer 161, the active layer 162, and the p-type layer 163, and then etching a predetermined part to form the n-electrode 164 and the p-electrode 165. In this case, the predetermined part which is a space for separating the n-electrode 164 and the p-electrode 165 from each other is etched to expose a part of the n-type layer 161. In other words, the surfaces of the light emitting diode 160 on which the n-electrode 164 and the p-electrode 165 are disposed are not flat surfaces, but may have different height levels.

As described above, in the etched area, in other words, on the n-type layer 161 exposed by the etching process, the n-electrode 164 is disposed. The n-electrode 164 may be formed of a conductive material. In the meantime, in an area which is not etched, in other words, on the p-type layer 163, the p-electrode 165 is disposed. The p-electrode 165 may also be formed of a conductive material, and for example, may be formed of the same material or substantially the same material as the n-electrode 164. In the meantime, the n-electrode 164 and the p-electrode 165 may be defined as a cathode and an anode, respectively.

In the meantime, in this specification, it has been described that the LED 160 is used as a light emitting element, but a quantum dot light emitting diode (QLED) may also be used as the light emitting element, and is not limited thereto.

An adhesive layer AD is disposed on top surfaces of the first connection pad 191 and the second connection pad 192 and between the first connection pad 191 and the second connection pad 192 so that the light emitting diode 160 may be bonded onto the first connection pad 191 and the second connection pad 192. In this case, the n-electrode 164 may be disposed on the first connection pad 191 and the p-electrode 165 may be disposed on the second connection pad 192.

The adhesive layer AD may be a conductive adhesive layer AD in which conductive balls are dispersed in an insulating base member. Therefore, the conductive balls are electrically connected in a portion applied with heat or pressure to have a conductive property and an area which is not pressurized may have an insulating property. For example, the n-electrode 164 is electrically connected to the first connection pad 191 and the first transistor TR1 by means of the adhesive layer AD. The p-electrode 165 may be electrically connected to the second connection pad 192 and the high potential power line VDD by means of the adhesive layer AD. That is, after applying the adhesive layer AD on the first connection pad 191 and the second connection pad 192 using an inkjet method, the light emitting diode 160 is transferred onto the adhesive layer AD and the light emitting diode 160 is pressurized and heated. By doing this, the first connection pad 191 is electrically connected to the n-electrode 164 and the second connection pad 192 may be electrically connected to the p-electrode 165. However, the remaining part of the adhesive layer AD excluding a part of the adhesive layer AD disposed between the n-electrode 164 and the first connection pad 191 and a part of the adhesive layer AD disposed between the p-electrode 165 and the second connection pad 192 has an insulating property. In the meantime, in FIG. 5, it is illustrated that the adhesive layer AD is also disposed between the first connection pad 191 and the second connection pad 192, but the adhesive layer AD may be separated to be individually disposed on the first connection pad 191 and the second connection pad 192.

As described above, when the stretchable display device 100 according to the embodiment of the present disclosure is turned on, different voltage levels which are applied to the first connection pad 191 and the second connection pad 192 are transmitted to the n-electrode 164 and the p-electrode 165. By doing this, the light emitting diode 160 emits light.

Referring to FIG. 5, the upper substrate US is disposed on the light emitting diode 160, and the lower substrate 110.

The upper substrate US is a substrate which supports various components disposed below the upper substrate US. Specifically, the upper substrate US is formed by coating a material which configures the upper substrate US on the lower substrate 110 and the pixel substrate 111 and then curing the material to be disposed to be in contact with the lower substrate 110, the pixel substrate 111, the connection substrate 120, and the connection line 180.

The upper substrate US which is a flexible substrate may be configured by an insulating material which is bendable or extendable. The upper substrate US is a flexible substrate so as to be reversibly expanded and contracted. Further, an elastic modulus of the upper substrate US may be several MPa to several hundreds of MPa and an extension rupture ratio may be 100% or higher. A thickness of the upper substrate US may be 10 μm to 1 mm, but is not limited thereto.

The upper substrate US may be formed of the same material or substantially the same material as the lower substrate 110. For example, the upper substrate US may be formed of a silicon rubber such as polydimethylsiloxane (PDMS) or an elastomer such as polyurethane (PU) or polytetrafluoroethylene (PTFE) and thus have a flexible property. However, the material of the upper substrate US is not limited thereto.

In the meantime, even though not illustrated in FIG. 5, a polarization layer may be disposed on the upper substrate US. The polarization layer may perform a function which polarizes light incident from the outside of the stretchable display device 100 to reduce the external light reflection. Further, an optical film other than the polarization layer may be disposed on the upper substrate US.

In the meantime, as described above with reference to FIGS. 2 and 3, in the stretchable display device 100 according to the embodiment of the present disclosure, the p-electrode 165 of the light emitting diode 160 which is the anode is connected to the high potential power line VDD. Further, the n-electrode 164 which is the cathode is connected to the driving circuit configured by a p-type thin film transistor. Therefore, a common anode structure may be configured. For example, the p-electrode 165 of each of the plurality of light emitting diodes 160 on one pixel substrate 111 may be electrically connected to one high potential power line VDD.

In the stretchable display device 100 according to the embodiment of the present disclosure, the LED is used as a light emitting diode 160 so that positions to which the n-electrode 164 and the p-electrode 165 of the LED are bonded are switched to transfer the LED. Therefore, the common anode structure may be easily implemented. For example, in order to implement the common cathode structure, the LED may be transferred by switching only the bonding positions of the n-electrode 164 and the p-electrode 165 of the LED. That is, unlike the display device of the related art using an organic light emitting diode, in the stretchable display device 100 according to the embodiment of the present disclosure, only the bonding position of the light emitting diode 160 is changed to easily implement the common anode structure.

Further, in the stretchable display device 100 according to the embodiment of the present disclosure, the sub pixel SPX is configured with a common anode structure. Therefore, influence of voltage drop of the high potential power signal on a potential of the second node N2 to which the first source electrode SE of the first transistor TR1 and the storage capacitor SC are connected may be removed. The high potential power line VDD is not directly connected to the second node N2, but is electrically connected to the p-electrode 165 which is an anode of the light emitting diode 160. The high potential power signal is not directly supplied to the second node N2, so that even though the voltage drop of the high potential power signal occurs, the potential of the second node N2 may be stably maintained. Therefore, the voltage difference Vgs between the first gate electrode GE and the first source electrode SE of the first transistor TR1 may be constantly maintained by the storage capacitor SC and the light emitting diode 160 may emit light with a uniform luminance. Accordingly, in the stretchable display device 100 according to the embodiment of the present disclosure, the second node N2 to which the first source electrode SE of the first transistor TR1 is connected and the high potential power lines VDD are separated. As a result, fluctuation of the second node N2 due to the voltage drop of the high potential power signal may be reduced.

Auxiliary Scan Line and Auxiliary Low Potential Power Line

Figure 6:
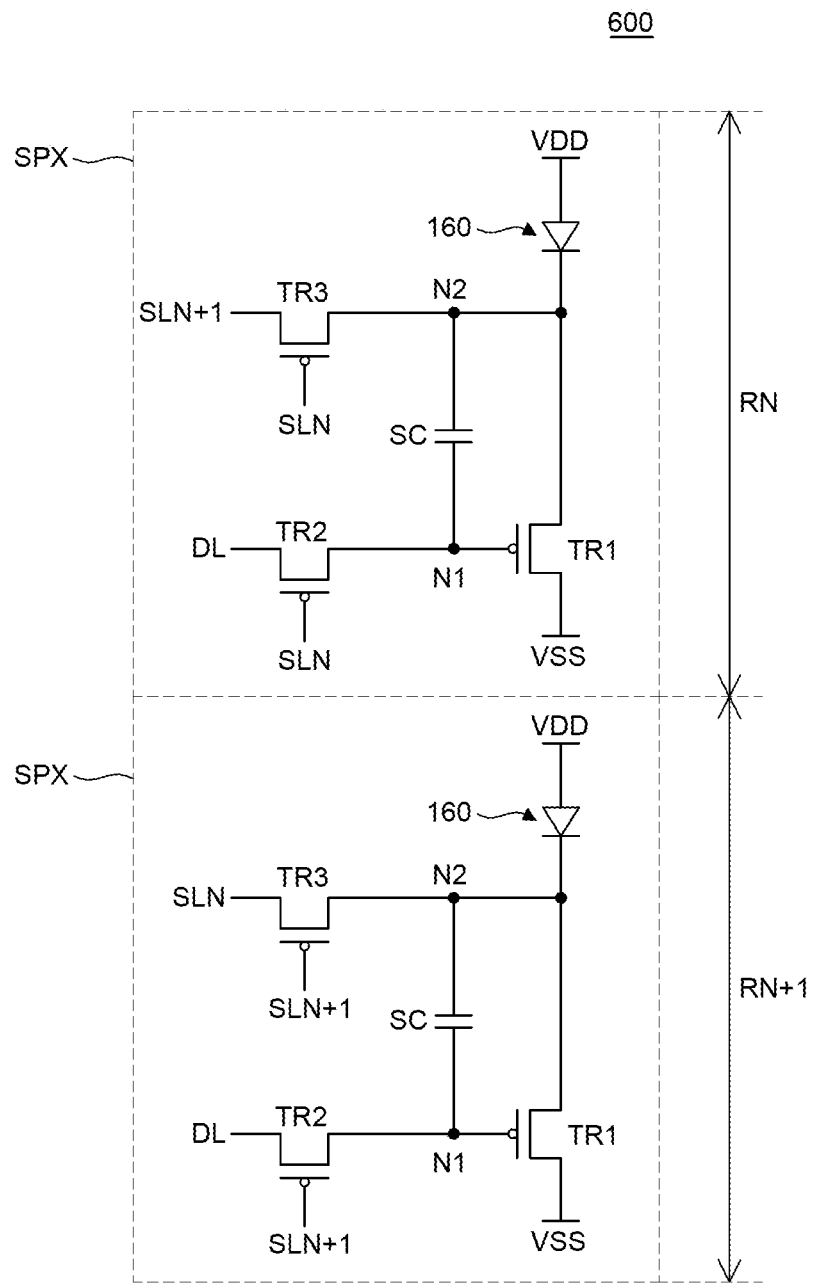
FIG. 6 is a circuit diagram of a plurality of sub pixels of a stretchable display device according to another embodiment of the present disclosure.
Figure 7:
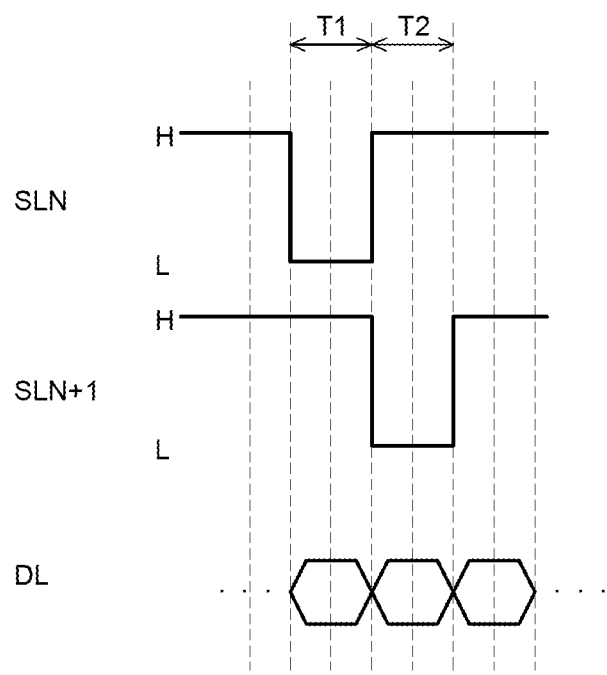
FIG. 7 is a timing diagram according to the circuit diagram of FIG. 6.

FIG. 6 is a circuit diagram of a plurality of sub pixels of a stretchable display device according to another embodiment of the present disclosure. FIG. 7 is a timing diagram according to the circuit diagram of FIG. 6. For the convenience of description, in FIG. 6, a circuit diagram of a sub pixel SPX disposed in an N-th row RN and a sub pixel SPX disposed in an N+1-th row RN+1 in the same column is illustrated. The only difference between a stretchable display device 600 according to another embodiment of the present disclosure and the stretchable display device 100 of FIGS. 1 to 5 is that instead of the reference line RL, a scan line and a third transistor TR3 in different rows are connected. However, the other configuration is substantially the same so that a redundant description will be omitted.

Referring to FIG. 6, a third source electrode of the third transistor TR3 is connected to the scan line SL. Specifically, a third source electrode of a third transistor TR3 of a sub pixel SPX in an N-th row RN may be connected to an N+1-th scan line SLN+1 connected to a second gate electrode of a second transistor TR2 of a sub pixel SPX in an N+1-th row RN+1. A third source electrode of a third transistor TR3 of a sub pixel SPX in an N+1-th row RN+1 may be connected to an N-th scan line SLN connected to a second gate electrode of a second transistor TR2 of a sub pixel SPX in an N-th row RN. That is, sub pixels SPX in the N-th row RN and the N+1-th row RN+1 may share the N-th scan line SLN and the N+1-th scan line SLN+1.

Referring to FIG. 7, during the first period T1, a low level of scan signal is supplied from the N-th scan line SLN and a high level of scan signal is supplied from the N+1-th scan line SLN+1. The first period T1 is a period when the second node N2 of the sub pixel SPX in the N-th row RN is initialized and a data signal is input to the sub pixel SPX in the N-th row RN, simultaneously.

When the low level of scan signal is supplied to the N-th scan line SLN during the first period T1, the second transistor TR2 and the third transistor TR3 of the sub pixel SPX in the N-th row RN may be simultaneously turned on.

When the second transistor TR2 in the N-th row RN is turned on, the data signal from the data line DL may be supplied to the first node N1 through the second transistor TR2. Therefore, the potential of the first node N1 may be charged with the data signal during the first period T1.

When the third transistor TR3 in the N-th row RN is turned on, a high level of scan signal from the N+1-th scan line SLN+1 may be supplied to the second node N2 through the third transistor TR3. Therefore, the potential of the second node N2 may be initialized with the high level of scan signal during the first period T1.

During the second period T2, the low level of scan signal is supplied to the N+1-th scan line SLN+1 and the high level of scan signal is supplied to the N-th scan line SLN. The second period T2 is a period when a light emitting diode 160 of the sub pixel SPX of the N-th row RN emits light. Further, the second period T2 is a period when the second node N2 of the sub pixel SPX in the N+1-th row RN+1 is initialized and a data signal is input to the sub pixel SPX in the N+1-th row RN+1, simultaneously.

The high level of scan signal is supplied to the N-th scan line SLN during the second period T2 so that the second transistor TR2 and the third transistor TR3 of the sub pixel SPX in the N-th row RN may be simultaneously turned off.

Even after the second transistor TR2 and the third transistor TR3 of the sub pixel SPX in the N-th row RN are turned off, the first node N1 and the second node N2 may maintain a constant voltage by the storage capacitor SC. Therefore, the voltage difference Vgs between the first gate electrode and the first source electrode of the first transistor TR1 is maintained by the storage capacitor SC so that the first transistor TR1 may be maintained to be turned on.

Further, during the second period T2 when the first transistor TR1 of the sub pixel SPX of the N-th row RN is turned on, the current may flow along the light emitting diode 160. Accordingly, during the second period T2, the first transistor TR1 of the sub pixel SPX of the N-th row RN is turned on and the light emitting diode 160 may emit light.

During the second period T2, the low level of scan signal is supplied to the N+1-th scan line SLN+1 so that the second transistor TR2 and the third transistor TR3 of the sub pixel SPX in the N+1-th row RN+1 are simultaneously turned on. Further, the high level of scan signal is supplied from the N-th scan line SLN, the second node N2 of the sub pixel in the N+1-th row RN+1 may be initialized with the high level of scan signal.

When the second transistor TR2 in the N+1-th row RN+1 is turned on, the data signal from the data line DL may be supplied to the first node N1 through the second transistor TR2. Therefore, the potential of the first node N1 of the N+1-th row RN+1 may be charged with the data signal during the second period T2.

When the third transistor TR3 in the N+1-th row RN+1 is turned on, a high level of scan signal from the N-th scan line SLN may be supplied to the second node N2 through the third transistor TR3. Therefore, the potential of the second node N2 may be initialized with the high level of scan signal during the second period T2.

In the stretchable display device 600 according to another embodiment of the present disclosure, instead of the reference line RL, a scan lines SL in an adjacent row is used to initialize the second node N2 so that a structure of the driving circuit may be simplified.

In this case, a part of the second connection line 182 which was connected to the reference line RL in the related art is used as an auxiliary scan line so that a driving circuit of FIG. 6 may be easily implemented on the pixel substrate 111.

Further, the other part of the second connection line 182 which was connected to the reference line RL is used as an auxiliary low potential power line to reduce or minimize the voltage drop of the low potential power signal.

Hereinafter, a structure of a plurality of sub pixels SPX including an auxiliary scan line and an auxiliary low potential power line will be described in more detail with reference to FIG. 8 together.

Figure 8:
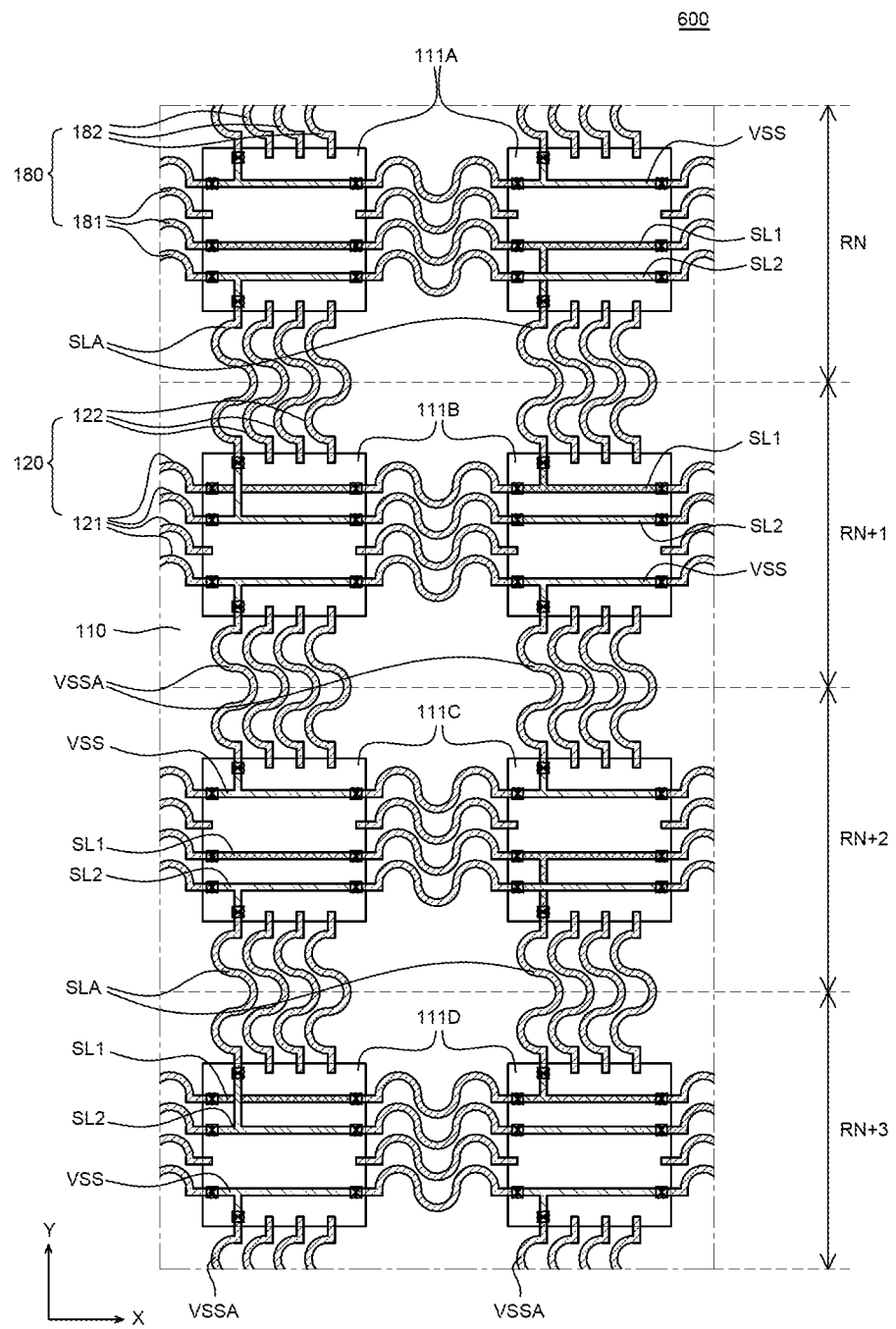
FIG. 8 is an enlarged plan view of a stretchable display device according to another embodiment of the present disclosure.

FIG. 8 is an enlarged plan view of a stretchable display device according to another embodiment of the present disclosure. In FIG. 8, for the convenience of description, the sub pixel SPX on the plurality of pixel substrates 111 is not illustrated, but a plurality of scan lines SL and low potential power line VSS on the plurality of pixel substrates 111 is illustrated. Referring to FIG. 8, the display device 600 according to another embodiment of the present disclosure further includes a plurality of third pixel substrates 111C, a plurality of fourth pixel substrate 111D, auxiliary scan lines SLA, and auxiliary low potential power lines VSSA, but the other configuration is substantially the same. Therefore, a redundant description will be omitted.

The plurality of pixel substrates 111 further includes a third pixel substrate 111C and a fourth pixel substrate 111D. The third pixel substrate 111C is disposed in an N+2-th row RN+2 among the plurality of rows and the fourth pixel substrate 111D is disposed in an N+3-th row RN+3 among the plurality of rows. The plurality of sub pixels SPX which is the same as those on the first pixel substrate 111A and the second pixel substrate 111B may be disposed on each of the third pixel substrate 111C and the fourth pixel substrate 111D. The third pixel substrate 111C and the fourth pixel substrate 111D may be disposed in a matrix to form a plurality of rows and a plurality of columns on the lower substrate 110 together with the first pixel substrate 111A and the second pixel substrate 111B.

The first pixel substrate 111A, the second pixel substrate 111B, the third pixel substrate 111C, and the fourth pixel substrate 111D may be sequentially and repeatedly disposed in the unit of rows. For example, the first pixel substrate 111A is disposed in a first row, the second pixel substrate 111B is disposed in a second row, the third pixel substrate 111C is disposed in a third row, and the fourth pixel substrate 111D may be disposed in a fourth row. Further, from the next row, the first pixel substrate 111A, the second pixel substrate 111B, the third pixel substrate 111C, and the fourth pixel substrate 111D may be sequentially disposed in the unit of rows again.

In the meantime, the first pixel substrate 111A and the second pixel substrate 111B may have the same wiring arrangement structure as the third pixel substrate 111C and the fourth pixel substrate 111D. For example, the wiring arrangement structure of the first pixel substrate 111A may be the same or substantially the same as the wiring arrangement structure of the third pixel substrate 111C and the wiring arrangement structure of the second pixel substrate 111B may be the same or substantially the same as the wiring arrangement structure of the fourth pixel substrate 111D.

A first scan line SL1 and a second scan line SL2 are disposed in each of the plurality of pixel substrates 111. The first scan line SL1 may correspond to the N-th scan line SLN described in detail with reference to FIGS. 6 and 7. The second scan line SL2 may correspond to the N+1-th scan line SLN+1 described in detail with reference to FIGS. 6 and 7. As described above, the first pixel substrate 111A and the second pixel substrate 111B may have the same or substantially the same wiring arrangement structure as the third pixel substrate 111C and the fourth pixel substrate 111D. Therefore, the first scan line SL1 of each of the first pixel substrate 111A and the second pixel substrate 111B may correspond to the N-th scan line SLN and the second scan line SL2 may correspond to the N+1-th scan line SLN+1. Further, the first scan line SL1 of each of the third pixel substrate 111C and the fourth pixel substrate 111D corresponds to the N-th scan line SLN and the second scan line SL2 corresponds to the N+1-th scan line SLN+1.

Hereinafter, the description will be made under the assumption that the first scan line SL1 on the first pixel substrate 111A, the second pixel substrate 111B, the third pixel substrate 111C and the fourth pixel substrate 111D corresponds to the N-th scan line SLN. The description will be made under the assumption that the second scan line SL2 on the first pixel substrate 111A, the second pixel substrate 111B, the third pixel substrate 111C and the fourth pixel substrate 111D corresponds to the N+1-th scan line SLN+1.

Referring to FIG. 8, the first scan line SL1 disposed on the first pixel substrate 111A of the N-th row RN, among the plurality of pixel substrates 111, may be electrically connected to the second gate electrode of the second transistor TR2 and the third gate electrode of the third transistor TR3 on the first pixel substrate 111A. The second scan line SL2 disposed on the first pixel substrate 111A may be electrically connected to the third source electrode of the third transistor TR3 on the first pixel substrate 111A.

The first scan line SL1 disposed on the second pixel substrate 111B of the N+1-th row RN+1, among the plurality of pixel substrates 111, may be electrically connected to the third source electrode of the third transistor TR3 on the second pixel substrate 111B. The second scan line SL2 disposed on the second pixel substrate 111B may be electrically connected to the second gate electrode of the second transistor TR2 and the third gate electrode of the third transistor TR3 on the second pixel substrate 111B.

Further, the first scan line SL1 and the second scan line SL2 on the third pixel substrate 111C may be connected in the same or similar manner as the first scan line SL1 and the second scan line SL2 on the first pixel substrate 111A. Furthermore, the first scan line SL1 and the second scan line SL2 on the fourth pixel substrate 111D may be connected in the same or similar manner as the first scan line SL1 and the second scan line SL2 on the second pixel substrate 111B. For example, the first scan line SL1 disposed on the third pixel substrate 111C in the N+2-th row RN+2 may be electrically connected to the second gate electrode and the third gate electrode.

The auxiliary scan lines SLA are disposed on some second connection substrates 122 among the plurality of second connection substrates 122. The auxiliary scan line SLA may be disposed on the second connection substrate 122 disposed between the N-th row RN and the N+1-th row RN+1. Further, the auxiliary scan line SLA may be disposed on the second connection substrate 122 disposed between the N+2-th row RN+2 and an N+3-th row RN+3. The auxiliary scan line SLA is a wiring line which electrically connects scan lines SL to which the same scan signal is transmitted between the pixel substrates 111 in adjacent rows.

The auxiliary scan line SLA is disposed on the second connection substrate 122 extending in the Y-axis direction to electrically connect the first scan lines SL1 disposed on adjacent pixel substrates 111 to each other and electrically connect the second scan lines SL2 to each other. For example, the first scan line SL1 of the first pixel substrate 111A in the N-th row RN and the first scan line SL1 of the second pixel substrate 111B in the N+1-th row RN+1 may be electrically connected by the auxiliary scan line SLA. The second scan line SL2 of the first pixel substrate 111A in the N-th row RN and the second scan line SL2 of the second pixel substrate 111B in the N+1-th row RN+1 may be electrically connected by the auxiliary scan line SLA.

Similarly, the first scan line SL1 and the second scan line SL2 of the third pixel substrate 111C of the N+2-th row RN+2 may be electrically connected to the first scan line SL1 and the second scan line SL2 of the fourth pixel substrate 111D of the N+3-th row RN+3, respectively, by the auxiliary scan line SLA. Accordingly, the same scan signal may be transmitted to the first scan line SL1 of the N-th row RN and the first scan line SL1 of the N+1-th row RN+1 by the auxiliary scan line SLA. Further, the same scan signal may be also transmitted to the second scan line SL2 of the N-th row RN and the second scan line SL2 of the N+1-th row RN+1 by the auxiliary scan line SLA. Further, the same scan signal may be transmitted to the first scan line SL1 of the N+2-th row RN+2 and the first scan line SL1 of the N+3-th row RN+3 by the auxiliary scan line SLA. Furthermore, the same scan signal may be also transmitted to the second scan line SL2 of the N+2-th row RN+2 and the second scan line SL2 of the N+3-th row RN+3 by the auxiliary scan line SLA.

Further, the second gate electrode of the second transistor TR2 and the third gate electrode of the third transistor TR3 on the first pixel substrate 111A in the N-th row RN and the third source electrode of the third transistor TR3 on the second pixel substrate 111B in the N+1-th row RN+1 may be connected to the first scan line SL1 to which the same scan signal is applied, by the auxiliary scan line SLA. The third source electrode on the first pixel substrate 111A in the N-th row RN and the second gate electrode and the third gate electrode on the second pixel substrate 111B in the N+1-th row RN+1 may also be connected to the second scan line SL2 to which the same scan signal is applied, by the auxiliary scan line SLA. Similarly, the same scan signal is simultaneously input to the second gate electrode and the third gate electrode on the third pixel substrate 111C in the N+2-th row RN+2 and the third source electrode on the fourth pixel substrate 111D in the N+3-th row RN+3. Further, the same scan signal may be simultaneously input to the third source electrode on the third pixel substrate 111C in the N+2-th row RN+2 and the second gate electrode and the third gate electrode on the fourth pixel substrate 111D in the N+3-th row RN+3. Accordingly, as the scan lines SL in the adjacent rows are electrically connected to each other by the auxiliary scan line SLA, the same driving circuit as illustrated in the circuit diagram of FIG. 6 may be implemented on the plurality of pixel substrates 111.

The first scan line SL1 on the plurality of pixel substrates 111 may form a mesh shape, for example, a ladder shape, together with the first connection line 181 which connects the first scan lines SL1 in the X-axis direction, and the auxiliary scan line SLA which connects the first scan line SL1 in the Y-axis direction. The second scan line SL2 may also be connected to the first connection line 181 and the auxiliary scan line SLA to form a mesh shape. For example, the first scan lines SL1 in the N-th row RN are electrically connected to each other by the first connection line 181 in the X-axis direction and the first scan lines SL1 of the N+1-th row RN+1 are electrically connected to each other by the first connection line 181 in the X-axis direction. Further, the first scan line SL1 of the N-th row RN and the first scan line SL1 of the N+1-th row RN+1 are electrically connected by the auxiliary scan line SLA in the Y-axis direction. Therefore, the first scan lines SL1 in the N-th row RN and the N+1-th row RN+1 may be connected while forming a mesh shape together with the first connection line 181 and the auxiliary scan line SLA. Further, the second scan lines SL2 may also be connected to the first connection line 181 and the auxiliary scan line SLA while forming a mesh shape together.

The low potential power line VSS is disposed on each of the plurality of pixel substrates 111. The low potential power line VSS is electrically connected to the first drain electrodes DE of the plurality of first transistors TR1 on the plurality of pixel substrates 111.

The auxiliary low potential power line VSSA is disposed on some second connection substrates 122 among the plurality of second connection substrates 122. The auxiliary potential power line VSSA is a wiring line which electrically connects low potential power lines VSS on the pixel substrates 111 disposed side by side in the Y-axis direction. The auxiliary low potential power line VSSA may be disposed on the second connection substrate 122 between the second pixel substrate 111B in the N+1-th row RN+1 and the third pixel substrate 111C in the N+2-th row RN+2. The auxiliary low potential power line VSSA may be also disposed on the second connection substrate 122 between the fourth pixel substrate 111D in the N+3-th row RN+3 and the first pixel substrate 111A in the N-th row RN. For example, the auxiliary low potential power line VSSA may electrically connect the low potential power line VSS in the N+1-th row RN+1 and the low potential power line VSS in the N+2-th row RN+2.

In the meantime, an auxiliary low potential power line VSSA between the N+1-th row RN+1 and the N+2-th row RN+2 and an auxiliary scan line SLA between the N-th row RN and the N+1-th row RN+1 may be alternately disposed along the Y-axis direction. That is, the second connection substrate 122 on which the auxiliary low potential power line VSSA is disposed is a substrate which connects the second pixel substrate 111B and the third pixel substrate 111C. Further, the second connection substrate 122 on which the auxiliary scan line SLA is disposed may be a substrate which connects the first pixel substrate 111A and the second pixel substrate 111B. Therefore, the second connection substrate 122 on which the auxiliary low potential power line VSSA is disposed and the second connection substrate 122 on which the auxiliary scan line SLA is disposed may be alternately disposed in the Y-axis direction.

The low potential power line VSS on the plurality of pixel substrates 111 may form a mesh shape, for example, a ladder shape, together with the first connection line 181 which connects the low potential power line VSS in the X-axis direction and the auxiliary low potential power line VSSA which connects the low potential power line VSS in the Y-axis direction. For example, the low potential power lines VSS in the N+1-th row RN+1 are electrically connected to each other by the first connection line 181 in the X-axis direction and the low potential power lines VSS in the N+2-th row RN+2 may be electrically connected to each other by the first connection line 181 in the X-axis direction. Further, the low potential power line VSS in the N+1-th row RN+1 and the low potential power line VSS in the N+2-th row RN+2 are electrically connected by the auxiliary low potential power line VSSA in the Y-axis direction. Accordingly, the low potential power line VSS in the N+1-th row RN+1 and the low potential power line VSS in the N+2-th row RN+2 may be connected while forming a mesh shape together with the first connection line 181 and the auxiliary low potential power line VSSA.

In the meantime, even though in the present disclosure, a wiring line which electrically connects the low potential power lines VSS is defined as an auxiliary low potential power line VSSA, the auxiliary low potential power line VSSA may be referred to as an auxiliary second power line, but is not limited thereto.

In the meantime, the wiring connection structure of the first pixel substrate 111A and the second pixel substrate 111B may form vertical symmetry. The wiring connection structure of the third pixel substrate 111C and the fourth pixel substrate 111D may also form vertical symmetry. For example, the first scan line SL1 of the first pixel substrate 111A is electrically connected to the first scan line SL1 of the second pixel substrate 111B. Further, the low potential power line VSS of the first pixel substrate 111A is connected to the low potential power line VSS of the fourth pixel substrate 111D and the low potential power line VSS of the second pixel substrate 111B is electrically connected to the low potential power line VSS of the third pixel substrate 111C. That is, the scan lines SL are connected between the first pixel substrate 111A and the second pixel substrate 111B and the low potential power lines VSS of the first pixel substrate 111A and the second pixel substrate 111B are connected to the low potential power lines VSS of the other pixel substrates 111C and 111D to form vertical symmetry. Therefore, the wiring connection structure of the first pixel substrate 111A and the second pixel substrate 111B may form vertical symmetry. Similarly, the wiring connection structure of the third pixel substrate 111C and the fourth pixel substrate 111D having the same or substantially the same wiring arrangement structure as the first pixel substrate 111A and the second pixel substrate 111B may also form vertical symmetry.

In the stretchable display device 600 according to another embodiment of the present disclosure, the auxiliary low potential power line VSSA which connects the low potential power lines VSS disposed in different rows to each other is disposed to reduce the voltage drop of the low potential power signal. The low potential power line VSS extends in the X-axis direction on the plurality of pixel substrates 111 and the first connection line 181 electrically connects the low potential power lines VSS on the pixel substrate 111 in the same row. For example, the low potential power lines VSS on the first pixel substrate 111A in the N-th row RN are electrically connected by the first connection line 181 in the X-axis direction. The low potential power lines VSS on the second pixel substrate 111B in the N+1-th row RN+1 may be electrically connected by the first connection line 181 in the X-axis direction. In this case, the auxiliary low potential power line VSSA which connects the low potential power lines VSS, in the Y-axis direction, is disposed to reduce the resistance of the low potential power line VSS. As the auxiliary low potential power line VSSA connects the low potential power lines VSS in different rows, the low potential power line VSS, the auxiliary low potential power line VSSA, and the first connection line 181 may be configured to have a mesh shape. Further, the resistance is reduced so that the voltage drop of the low potential power signal may be reduced. Accordingly, in the stretchable display device 600 according to another embodiment of the present disclosure, the low potential power lines VSS in different rows are connected also in the Y-axis direction. Therefore, the voltage drop of the low potential power signal may be reduced and luminance uniformity and the image quality may be improved.

In the stretchable display device 600 according to another embodiment of the present disclosure, signals of the scan lines SL in adjacent rows are used as reference signals for initializing the second node N2 between the storage capacitor SC and the first transistor TR1 to simplify the driving circuit. First, the data signals are sequentially input in the unit of rows to display images. For example, the data signal is input to the sub pixel SPX of the first pixel substrate 111A in the N-th row RN. While initializing the second node N2, the low level of scan signal is input to the first scan line SL1 connected to the second gate electrode and the third gate electrode. In this case, the high level signal may be continuously input to the scan line SL on the pixel substrate 111 in another row. While inputting the data signal, instead of separately inputting a reference signal for initializing the second node N2, the high level of scan signal of the scan line SL in the adjacent row may be used as a reference signal. To this end, the first scan line SL1 and the second scan line SL2 are disposed on the plurality of pixel substrates 111 and the first scan lines SL1 and the second scan lines SL2 in adjacent rows may be connected by the auxiliary scan line SLA, separately. Therefore, while inputting the low level of scan signal to the first scan line SL1, the high level of scan signal input to the second scan line SL2 may be used as a reference signal. While inputting the low level of scan signal to the second scan line SL2, the high level of scan signal input to the first scan line SL1 may be used as a reference signal. Therefore, in the stretchable display device 600 according to another embodiment of the present disclosure, scan lines SL in adjacent rows are connected by the auxiliary scan line SLA to utilize the scan signal applied to the scan line SL as a reference signal so that a circuit driving method may be simplified.

In the stretchable display device 600 according to another embodiment of the present disclosure, the auxiliary scan line SLA which connects the plurality of scan lines SL in the mesh shape and the auxiliary low potential power line VSSA which connects the plurality of low potential power lines VSS in the mesh shape are disposed. Therefore, the defects due to the crack and the disconnection of the wiring line may be reduced. The plurality of scan lines SL may be connected to each other in the X-axis direction, by the first connection line 181. The plurality of low potential power lines VSS may also be connected to each other in the X-axis direction, by the first connection line 181. If any one of the low potential power lines VSS on the first pixel substrate 111A and the first connection lines 181 which connects the low potential power lines VSS is cracked or disconnected, the low potential power signal is not appropriately supplied to the entire first pixel substrate 111A in the N-th row RN. Therefore, in the stretchable display device 600 according to another embodiment of the present disclosure, the plurality of scan lines SL and the plurality of low potential power lines VSS connected to each other in the X-axis direction are connected also in the Y-axis direction. Accordingly, even though the connection line 180 is cracked or disconnected, the scan signal and the low potential power signal may bypass along the auxiliary scan line SLA and the auxiliary low potential power line VSSA to be transmitted to the other pixel substrate 111. Therefore, in the stretchable display device 600 according to another embodiment of the present disclosure, the auxiliary scan line SLA and the auxiliary low potential power line VSSA are disposed to form a bypassing route of the signal. As a result, defective sub pixels SPX caused by the crack and the disconnection of the wiring lines may be reduced.

Mirror Stretchable Display Device

Figure 9:
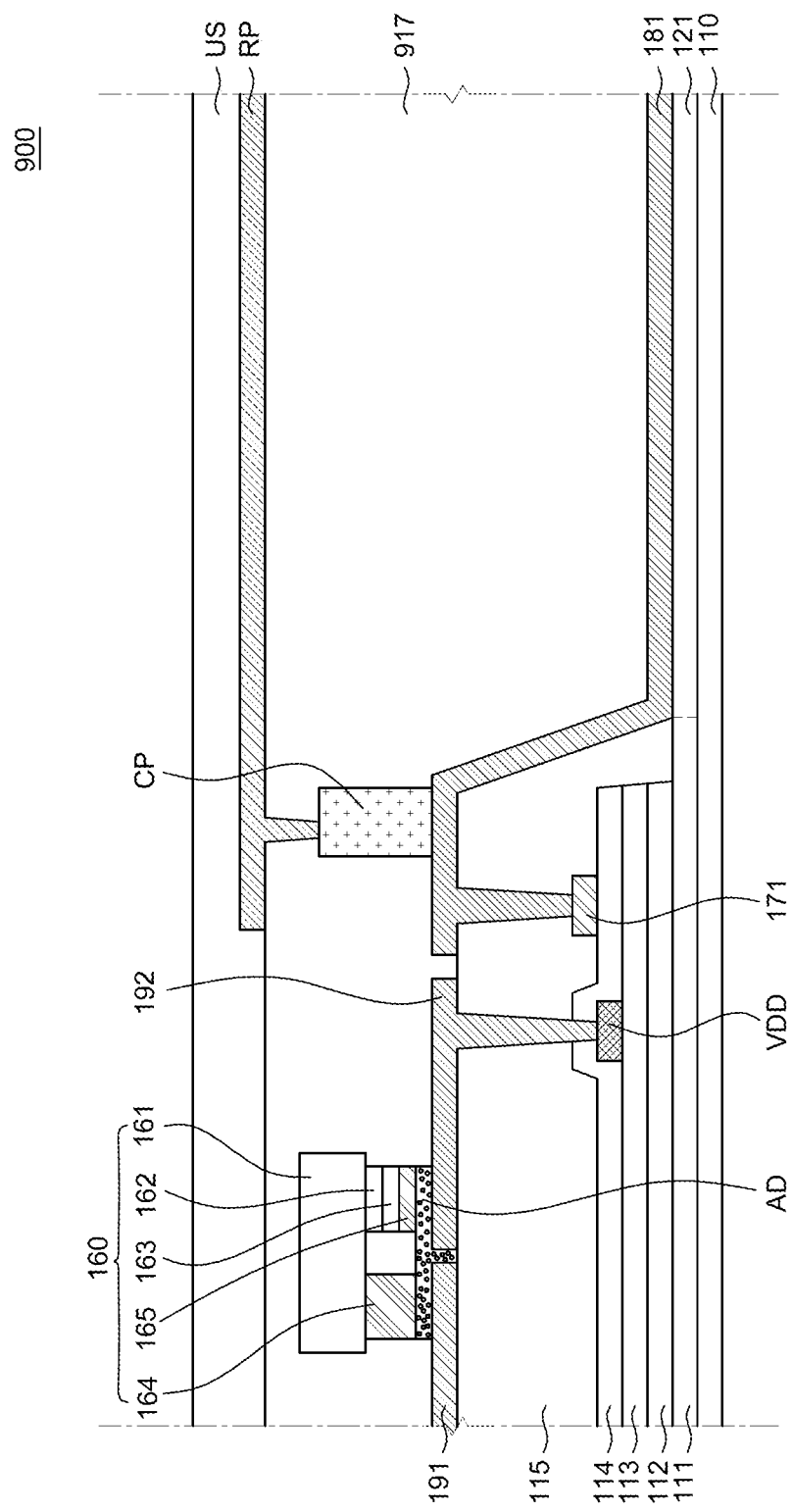
FIG. 9 is a schematic cross-sectional view of a stretchable display device according to still another embodiment of the present disclosure.

FIG. 9 is a schematic cross-sectional view of one sub pixel of a stretchable display device according to still another embodiment of the present disclosure. As compared with the stretchable display device 100 of FIGS. 1 to 5, a stretchable display device 900 of FIG. 9 further includes an insulating layer 917, a contact unit CP, and a reflection pattern RP, but the other configuration is substantially the same, so that a redundant description will be omitted.

Referring to FIG. 9, an insulating layer 917 is disposed between the upper substrate US and the low substrate 110. Specifically, the insulating layer 917 is disposed to cover the light emitting diode 160 and the lower substrate 110. The insulating layer 917 may be configured by an insulating material which is bendable or extendable and may be formed of the same material or substantially the same material as the lower substrate 110 and the upper substrate US. For example, the insulating layer 917 may be formed of a silicon rubber such as polydimethylsiloxane (PDMS) or an elastomer such as polyurethane (PU) or polytetrafluoroethylene (PTFE), but is not limited thereto.

A reflection pattern RP is disposed on the insulating layer 917. The reflection pattern RP may be disposed so as to overlap with at least some connection substrates 120 among the plurality of connection substrates 120. The reflection pattern RP which is disposed so as to overlap with the plurality of connection substrates 120 may overlap with the plurality of connection lines 180. The reflection pattern RP may be formed to have the same or substantially the same shape as the plurality of connection substrates 120 and the plurality of connection lines 180. For example, the reflection pattern RP may be formed to have a wavy shape, similarly to the plurality of connection substrates 120 and the plurality of connection lines 180.

The reflection pattern RP is disposed on the plurality of connection lines 180 to reduce or minimize the visibility of the plurality of connection lines 180 to the user. The reflection pattern RP is formed of a material different from that of the plurality of connection lines 180 so that it is possible to reduce or minimize the visibility of the color of the plurality of connection lines 180.

Specifically, only the insulating layer 917 and the upper substrate US which are transparent may be disposed on the plurality of connection substrates 120 and the plurality of connection lines 180 disposed between the plurality of pixel substrates 111 and the connection lines 180 may be visible. For example, when the plurality of connection lines 180 is formed of red copper, the red connection lines 180 may be visible to the user. Therefore, the reflection pattern RP is disposed so as to overlap with at least some connection lines 180 among the plurality of connection lines 180 between the insulating layer 917 and the upper substrate US to reduce or minimize the visibility of the plurality of connection lines 180.

In the meantime, the reflection pattern RP may be configured by a material having an excellent reflectance to implement a mirror stretchable display device 900. Specifically, when the stretchable display device 900 does not display images, the reflection pattern RP reflects external light to use the stretchable display device 900 as a mirror.

The reflection pattern RP may be configured by a transition metal having an s shell as an outer shell in which a difference between an energy of a d shell adjacent to the s shell and an energy of the s shell is 2.7 eV or higher, among materials having an excellent reflectance. If the reflection pattern RP is formed of a material in which the difference between the energy of the s shell and the energy of the d shell is 2.7 eV or lower, such as copper or gold, in an excited state, the material absorbs blue light having a short wavelength and may reflect red light having a long wavelength. Further, when the material in which the energy difference of the s shell and the d shell is 2.7 eV or lower is transited from the excited state to a normal state, the material may emit light of infrared ray from red light having a long wavelength among visible rays. Accordingly, when the reflection pattern RP is formed of the material in which the energy difference of the s shell and the d shell is 2.7 eV or lower, such as copper or gold, the red or gold reflection pattern RP may be visible to the user.

Therefore, the reflection pattern RP may be configured by a transition metal having an excellent reflectance and having an energy difference between the d shell adjacent to the s shell and the s shell which is 2.7 eV or higher. For example, the reflection pattern RP may be configured by silver (Ag) in which the energy difference between the d shell and the s shell is 4.8 eV. Further, the reflection pattern RP may be configured by any one of silver alloy (Ag-alloy), aluminum (Al), aluminum alloy (Al-alloy), molybdenum (Mo), or titanium (Ti) in addition to silver. Further, the reflection pattern RP is formed of silver nano wire to easily extend the stretchable display device 900, but is not limited thereto.

The reflection pattern RP may reduce or minimize distortion of the low potential power signal or the high potential power signal in accordance with the resistance. The reflection pattern RP is electrically connected to the high potential power line VDD or the low potential power line VSS to reduce the resistance of the high potential power line VDD or the low potential power line VSS. For example, the voltage drop of the high potential power signal which passes through the high potential power line VDD may be caused by the resistance of the high potential power line VDD. When the voltage drop is caused, the constant high potential power signal is not supplied to the plurality of sub pixels SPX of the stretchable display device 900 so that the luminance of the stretchable display device 900 may not be uniform and the image quality may be degraded.

Therefore, the high potential power line VDD or the low potential power line VSS and the reflection pattern RP are electrically connected to lower the resistance. For example, the reflection pattern RP is electrically connected to the plurality of connection lines 180 which is electrically connected to the high potential power line VDD or the low potential power line VSS to lower the resistance of the high potential power line VDD or the low potential power line VSS. Therefore, the voltage drop of high potential power signal or the low potential power signal may be reduced.

In order to electrically connect the reflection pattern RP to the high potential power line VDD or the low potential power line VSS, the contact unit CP is disposed between the reflection pattern RP and the connection line 180. The contact unit CP may be disposed on the pixel substrate 111 to be in contact with a top surface of the connection line 180 which is electrically connected to the high potential power line VDD and the low potential power line VSS among the plurality of connection lines 180. The contact unit CP may be formed of various conductive materials, for example, a metal material formed of any one of molybdenum (Mo), aluminum (Al), chrome (Cr), gold (Au), titanium (Ti), nickel (Ni), neodymium (Nd), and copper (Cu) or an alloy of two or more of them, or a multi-layer thereof, but it is not limited thereto.

In the meantime, the contact unit CP disposed on a top surface of a part of the connection line 180 extending to the top surface of the planarization layer 115 may be disposed on the pixel substrate 111 in the same or similar manner as the light emitting diode 160. For example, after forming a conductive material layer which forms the contact unit CP on a temporary substrate, the conductive material layer is patterned to form a plurality of contact units CP. Further, the plurality of contact units CP on the temporary substrate may be transferred onto the pixel substrate 111 before forming the insulating layer 917, using a transfer substrate such as a donor. However, the contact unit CP may be formed immediately on the pixel substrate 111, rather than the transferring method, but is not limited thereto.

In the stretchable display device 900 according to still another embodiment of the present disclosure, the reflection pattern RP is disposed on the plurality of connection lines 180 so as to overlap with the plurality of connection lines 180 to reduce or minimize the visibility of the connection lines 180. Only the insulating layer 917 and the upper substrate US are disposed on the connection line 180 between the plurality of pixel substrates 111. Further, when the connection line 180 is formed of a colored material such as copper, the connection line 180 on which only the insulating layer 917 and the upper substrate US which are transparent are disposed may be visible to the user. Therefore, the reflection pattern RP is disposed so as to overlap with at least some connection lines 180 among the plurality of connection lines 180 on the insulating layer 917 to reduce or minimize, by a user, the visibility of the plurality of connection lines 180. The reflection pattern RP disposed so as to overlap with the plurality of connection lines 180 is formed of a material different from that of the connection line 180 to block the connection line 180 which is formed of the colored material such as copper having a red color so as not to be visible to the user. Accordingly, in the stretchable display device 900 according to still another embodiment of the present disclosure, the reflection pattern RP which overlaps with the plurality of connection lines 180 is disposed so that the problem in that the connection line 180 is visible to the user to be recognized as a stain may be reduced.

In the stretchable display device 900 according to still another embodiment of the present disclosure, the reflection pattern RP is electrically connected to at least some lines of the plurality of lines to reduce the resistance. For example, the plurality of low potential power lines VSS or the plurality of high potential power lines VDD may transmit the same low potential power signal and the same high potential power signal to the plurality of sub pixels SPX.

However, the voltage drop, that is, the fluctuation of the low potential power signal and the high potential power signal may be caused due to the resistance of the wiring line and irregular low potential power signal and high potential power signal may be transmitted to each of the plurality of sub pixels SPX. In this case, the high potential power line VDD or the low potential power line VSS may be electrically connected to the reflection pattern RP using the contact unit CP. Therefore, the resistance of the high potential power line VDD or the low potential power line VSS is reduced to reduce or minimize the voltage drop and the uniform high potential power signal or the uniform low potential power signal may be transmitted to each of the plurality of sub pixels SPX. Accordingly, in the stretchable display device 900 according to still another embodiment of the present disclosure, the reflection pattern RP is electrically connected to the high potential power line VDD or the low potential power line VSS to reduce or minimize the voltage drop. Further, the uniformity of the luminance and the image quality may be improved.

The stretchable display device 900 according to still another embodiment of the present disclosure may be implemented as a mirror stretchable display device 900 by implementing the reflection pattern RP with a material having an excellent reflectance. When the reflection pattern RP is formed of a material having an excellent reflectance, such as silver, the reflectance of the external light may be increased. If the stretchable display device 900 is turned off, the external light reflected from the reflection pattern RP may allow the stretchable display device 900 to be used as a mirror. Accordingly, in the stretchable display device 900 according to still another embodiment of the present disclosure, the reflection pattern RP which is disposed to reduce the resistance of the wiring line and reduce or minimize the visibility of the connection line 180 to the user is formed of a material having an excellent reflectance. By doing this, the mirror stretchable display device 900 may be implemented.

Figure 10:
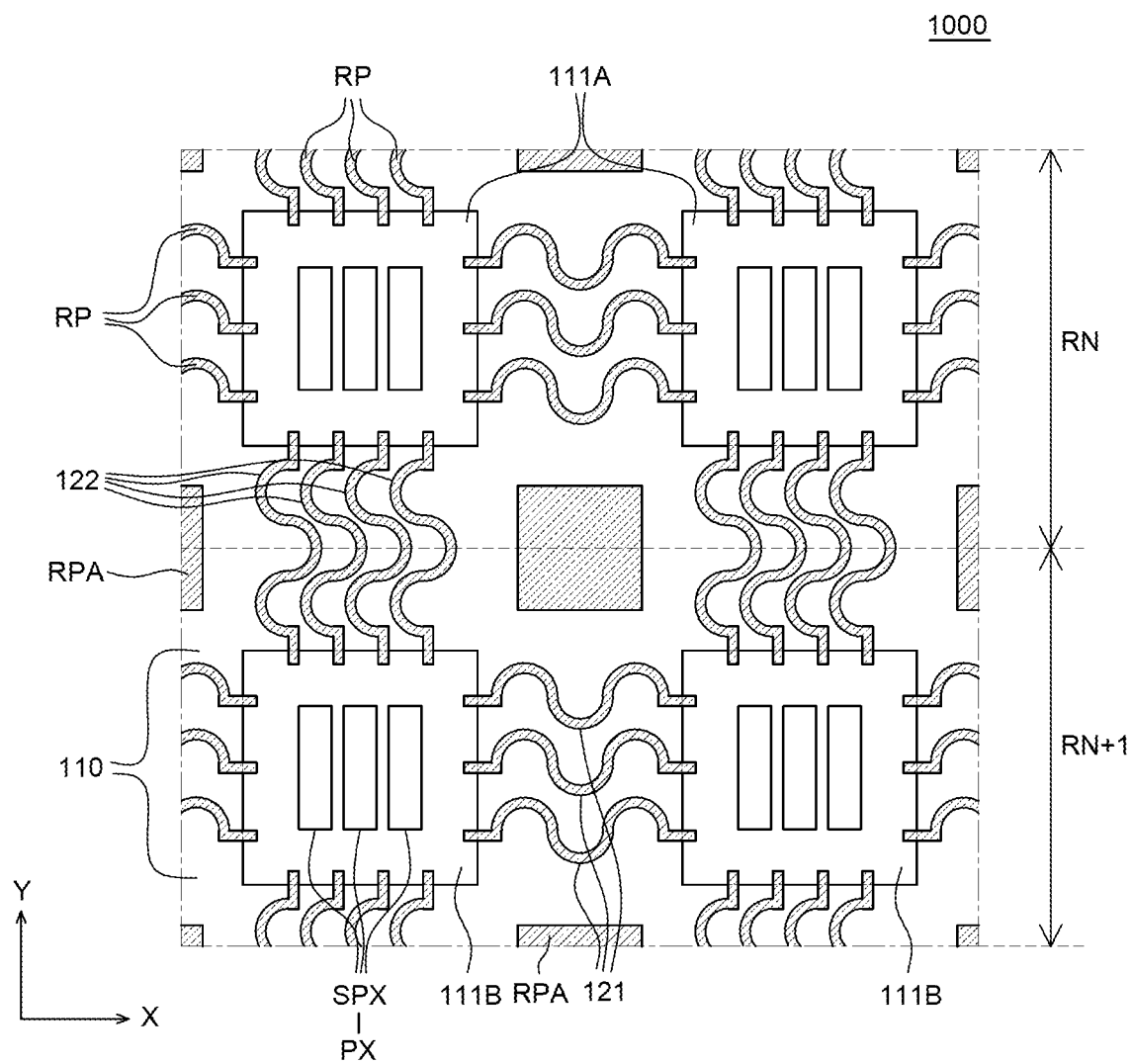
FIG. 10 is an enlarged plan view of a stretchable display device according to still another embodiment of the present disclosure.
Figure 11:
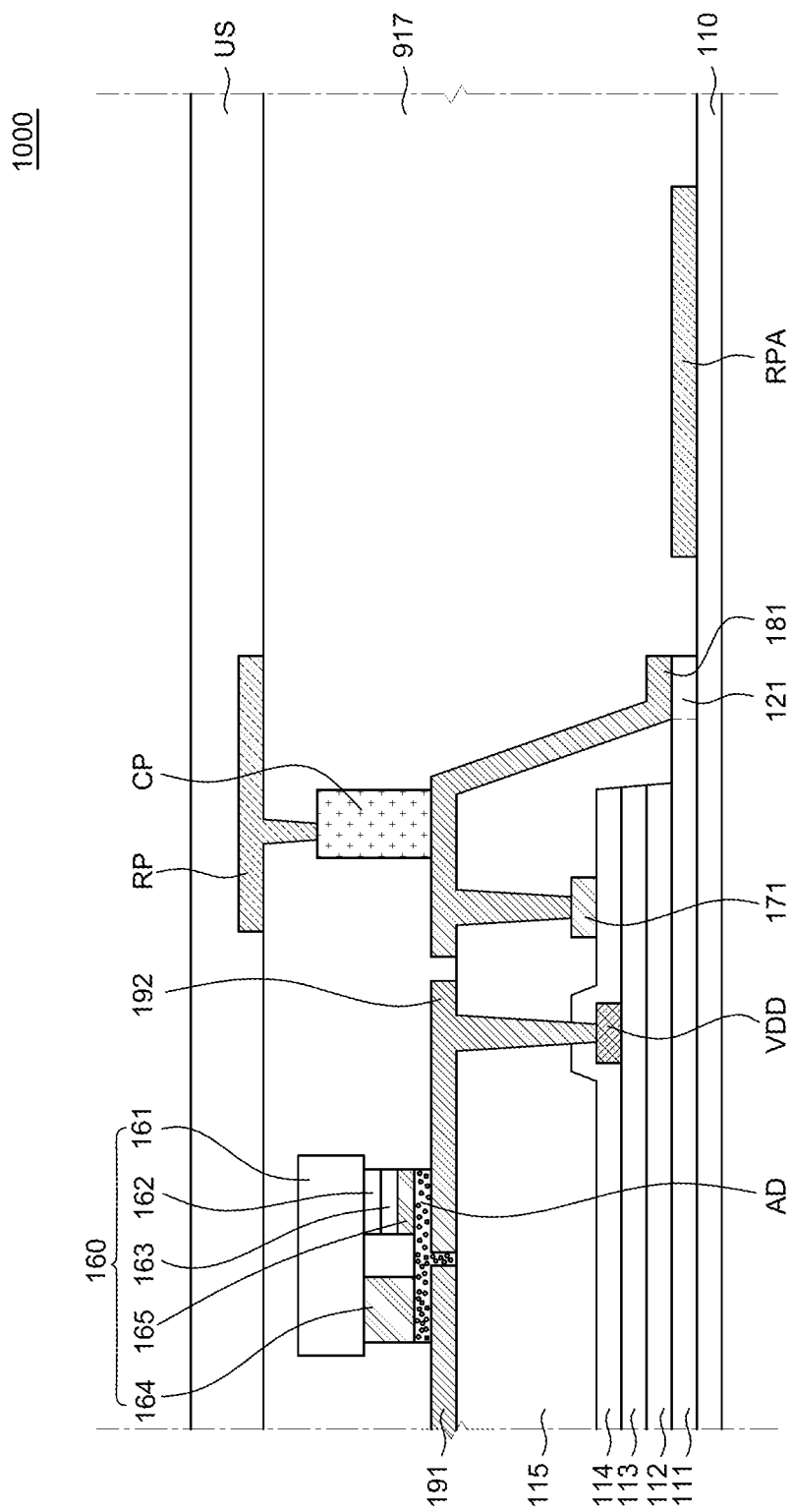
FIG. 11 is a schematic cross-sectional view of one sub pixel of FIG. 10.

FIG. 10 is an enlarged plan view of a stretchable display device according to still another embodiment of the present disclosure. FIG. 11 is a schematic cross-sectional view of one sub pixel of FIG. 10. As compared with the stretchable display device 900 of FIG. 9, a stretchable display device 1000 of FIGS. 10 and 11 further includes an additional reflection pattern RPA, but the other configuration is substantially the same, so that a redundant description will be omitted.

Referring to FIGS. 10 and 11, a stretchable display device 1000 according to still another embodiment of the present disclosure includes an additional reflection pattern RPA. The additional reflection patter RPA is disposed between the lower substrate 110 and the insulating layer 917 to be spaced apart from the plurality of pixel substrates 111 and the plurality of connection substrates 120. The additional reflection pattern RPA may be disposed in a partial area of the lower substrate 110 in which the plurality of pixel substrates 111, the plurality of connection substrates 120, and the plurality of peripheral substrates 131 are not disposed.

In the meantime, in FIGS. 10 and 11, it is illustrated that the additional reflection pattern RPA is disposed between the lower substrate 110 and the insulating layer 917. However, as long as the additional reflection pattern RPA is spaced apart from the plurality of pixel substrates 111 and the plurality of connection substrates 120, the additional reflection pattern RPA may be disposed between the insulating layer 917 and the upper substrate US, but is not limited thereto.

The additional reflection pattern RPA may implement a mirror stretchable display device 1000 with an improved reflectance. As described above with reference to FIG. 9, when the stretchable display device 1000 is turned off, the reflection pattern RP having an excellent reflectance reflects the external light so that the stretchable display device 1000 may be used as a mirror. In this case, the additional reflection pattern RPA is further disposed in an empty space where the pixel substrate 111, the connection substrate 120, and the peripheral substrate 131 are not disposed to increase the reflectance of the stretchable display device 1000. Further, the stretchable display device 1000 with an improved reflectance may serve as a clearer mirror.

The stretchable display device 1000 according to still another embodiment of the present disclosure utilizes an empty area of the lower substrate 110 to improve the reflectance of the stretchable display device 1000. The plurality of pixel substrates 111, the plurality of peripheral substrates 131, and the plurality of connection substrates 120 are disposed on the lower substrate 110. The plurality of pixel substrates 111 and the plurality of peripheral substrates 131 may be disposed in a matrix to form a plurality of rows and columns. Further, the plurality of connection substrates 120 may be disposed to extend in the X-axis direction and the Y-axis direction between the plurality of pixel substrates 111 and the plurality of peripheral substrates 131. In this case, as the plurality of pixel substrates 111 and the plurality of peripheral substrates 131 are disposed on the lower substrate 110 in a matrix, there may be an area in a diagonal direction of the plurality of pixel substrates, that is, an empty area whose four surfaces are enclosed by the plurality of connection substrates 120. The additional reflection pattern RPA formed of a material having an excellent reflectance is further disposed in the empty space spaced apart from the plurality of pixel substrates 111, the plurality of peripheral substrates 131, and the plurality of connection substrates 120. By doing this, a mirror stretchable display device 1000 with an improved reflectance may be improved. Further, as the reflectance is further improved, the mirror stretchable display device 1000 may serve as a clearer mirror. Accordingly, in the stretchable display device 1000 according to still another embodiment of the present disclosure, the additional reflection pattern RPA is further disposed in the empty area on the lower substrate 110 to use a mirror stretchable display device 1000 with an improved reflectance.

The embodiments of the present disclosure can also be described as follows:

According to an aspect of the present disclosure, there is provided a stretchable display device. The stretchable display device includes a lower substrate, a plurality of pixel substrates which is disposed on the lower substrate to be spaced apart from each other, a plurality of first power lines disposed on the plurality of pixel substrates, a plurality of second power lines disposed on the plurality of pixel substrates, a plurality of driving transistors which is disposed on the plurality of pixel substrates and is electrically connected to the plurality of second power lines, and a plurality of light emitting diodes which is disposed on the plurality of pixel substrates and includes anodes electrically connected to the plurality of first power lines and cathodes electrically connected to the plurality of driving transistors.

The anode on each of the plurality of light emitting diodes on one pixel substrate among the plurality of pixel substrates may be electrically connected to one first power line among the plurality of first power lines.

The stretchable display device may further include a switching transistor which is disposed on the plurality of pixel substrates and is electrically connected to each of the plurality of driving transistors, a sensing transistor which is disposed on the plurality of pixel substrates and is electrically connected to each of the plurality of driving transistor and each of the plurality of light emitting diodes, a plurality of N-th scan lines disposed on the plurality of pixel substrates, and a plurality of N+1-th scan lines disposed on the plurality of pixel substrates. A gate electrode of the switching transistor and a gate electrode of the sensing transistor on one pixel substrate among the plurality of pixel substrates may be simultaneously electrically connected to one N-th scan line among the plurality of N-th scan lines.

The plurality of pixel substrates may include a plurality of first pixel substrates disposed in an N-th row and a plurality of second pixel substrates disposed in an N+1-th row, an N-th scan line disposed on the plurality of first pixel substrates among the plurality of N-th scan lines is electrically connected to the gate electrode of the switching transistor and the gate electrode of the sensing transistor on the plurality of first pixel substrates, an N-th scan line disposed on the plurality of second pixel substrates, among the plurality of N-th scan lines, may be electrically connected to a source electrode of the sensing transistor on the plurality of second pixel substrates, an N+1-th scan line disposed on the plurality of first pixel substrates, among the plurality of N+1-th scan lines, may be electrically connected to the source electrode of the sensing transistor, and an N+1-th scan line disposed on the plurality of second pixel substrates, among the plurality of N+1-th scan lines, may be electrically connected to the gate electrode of the switching transistor and the gate electrode of the sensing transistor on the plurality of second pixel substrates.

The stretchable display device may further include a plurality of first connection substrates which connects the plurality of pixel substrates in a row direction, a plurality of second connection substrates which connects the plurality of pixel substrates in a column direction, and an auxiliary scan line which is disposed on some of the second connection substrates among the plurality of second connection substrates and electrically connects an N-th scan line on the plurality of first pixel substrates and an N-th scan line on the plurality of second pixel substrates, among the plurality of N-th scan lines.

The auxiliary scan line may electrically connect an N+1-th scan line on the plurality of first pixel substrates and an N+1-th scan line on the plurality of second pixel substrates, among the plurality of N+1-th scan lines.

The plurality of pixel substrates may further include a plurality of third pixel substrates disposed in an N+2-th row, and an auxiliary second power line may be further disposed on some of the second connection substrates among the plurality of second connection substrates so as to electrically connect second power lines disposed on the plurality of second pixel substrates and the plurality of third pixel substrates, among the plurality of second power lines.

The plurality of N-th scan lines and the auxiliary scan line, the plurality of N+1-th scan lines and the auxiliary scan line, and the second power line and the auxiliary second power line may form a mesh shape, individually.

The stretchable display device may further include an insulating layer which is disposed on the plurality of light emitting diodes so as to cover the lower substrate, a reflection pattern which is disposed on the insulating layer and overlaps with at least some of the first connection substrates and at least some of the second connection substrates, among the plurality of first connection substrates and the plurality of second connection substrates, and an upper substrate which is disposed so as to cover the reflection pattern and the insulating layer. The reflection pattern may have the same or substantially the same shape as the plurality of first connection substrates and the plurality of second connection substrates.

The reflection pattern may be configured by a transition metal having an s shell as an outer shell in which an energy difference of a d shell adjacent to the s shell and the s shell is 2.7 eV or higher.

The reflection pattern may be configured by any one of silver (Ag), silver alloy (Ag-alloy), aluminum (Al), aluminum alloy (Al-alloy), molybdenum (Mo), and titanium (Ti).

The stretchable display device may further include a contact unit which connects the plurality of first power lines or the plurality of second power lines to the reflection pattern through a contact hole of the insulating layer.

The stretchable display device may further include an additional reflection pattern disposed between the insulating layer and the lower substrate to be spaced apart from the plurality of pixel substrates, the plurality of first connection substrates, and the plurality of second connection substrates.

The insulating layer may be configured by the same material or substantially the same material as the upper substrate.

According to another aspect of the present disclosure, there is provided a stretchable display device. The stretchable display device includes a lower substrate which includes a plurality of first lower patterns spaced apart from each other and a second lower pattern which encloses the first lower patterns and has a modulus lower than that of the first lower patterns, a plurality of pixel substrates which is disposed on the plurality of first lower patterns and defines a plurality of sub pixels, a plurality of light emitting diodes which is disposed on the plurality of pixel substrates and includes an anode and a cathode, a plurality of driving transistors which is disposed on the plurality of pixel substrates and is electrically connected to the cathode, a plurality of first power lines which is disposed on the plurality of pixel substrates and is electrically connected to the anode, a plurality of second power lines which is disposed on the plurality of pixel substrates and is electrically connected to the plurality of driving transistors, and a plurality of connection substrates which is disposed on the second lower pattern and connects the plurality of pixel substrates.

The stretchable display device may further include a plurality of switching transistors which is disposed on the plurality of pixel substrates and is electrically connected to gate electrodes of the plurality of driving transistors, a plurality of sensing transistors which is disposed on the plurality of pixel substrates and is electrically connected between the plurality of driving transistor and the plurality of light emitting diodes, and a plurality of scan lines which is disposed on the plurality of pixel substrates and is electrically connected to gate electrodes of the plurality of switching transistors and gate electrodes of the plurality of sensing transistors.

The plurality of pixel substrates may include a plurality of first pixel substrates disposed in a plurality of N-th rows, a plurality of second pixel substrates which is disposed in a plurality of N+1-th rows adjacent to the plurality of N-th rows, a plurality of third pixel substrates which is disposed in a plurality of N+2-th rows adjacent to the plurality of N+1-th rows, and a plurality of fourth pixel substrates which is disposed in a plurality of N+3-th rows between the plurality of N+2-th rows and the plurality of N-th rows, and the scan line may include an N-th scan line disposed on the plurality of pixel substrates, and an N+1-th scan line disposed on the plurality of pixel substrates.

The N-th scan line may be electrically connected to the gate electrodes of the plurality of switching transistors and the gate electrodes of the plurality of sensing transistors on the plurality of first pixel substrates and the plurality of third pixel substrates. The N-th scan line may be connected to the source electrodes of the plurality of sensing transistors on the plurality of second pixel substrates and the plurality of fourth pixel substrates. The N+1-th scan line may be electrically connected to the source electrodes of the plurality of sensing transistors on the plurality of first pixel substrates and the plurality of third pixel substrates. The N+1-th scan line may be electrically connected to the gate electrodes of the plurality of switching transistors and the gate electrodes of the plurality of sensing transistors on the plurality of second pixel substrates and the plurality of fourth pixel substrates.

The stretchable display device may further include an auxiliary scan line which is disposed on some connection substrates which connect the plurality of first pixel substrates and the plurality of second pixel substrates, among the plurality of connection substrates and the other connection substrates which connect the plurality of third pixel substrates and the plurality of fourth pixel substrates. The auxiliary scan line may electrically connect the N-th scan line of the plurality of first pixel substrates and the N-th scan line of the plurality of second pixel substrates and may electrically connect the N-th scan line of the plurality of third pixel substrates and the N-th scan line of the plurality of fourth pixel substrates.

Components of the plurality of N-th rows and the plurality of N+1-th rows may form the same or substantially the same structure as components of the plurality of N+2-th rows and the plurality of N+3-th rows, and components of the plurality of N-th rows and components of the plurality of N+1-th rows may form vertical symmetry.

The stretchable display device may further include an auxiliary second power line which is disposed on some connection substrates which connect the plurality of first pixel substrates and the plurality of fourth pixel substrates, among the plurality of connection substrates and the other connection substrates which connect the plurality of second pixel substrates and the plurality of third pixel substrates. The auxiliary second power line may electrically connect the second power lines on the plurality of first pixel substrates and the plurality of fourth pixel substrates and may electrically connect the second power lines on the plurality of second pixel substrates and the plurality of third pixel substrates.

The stretchable display device may further include an insulating layer which is disposed on the plurality of light emitting diodes and the plurality of connection substrates, a reflection pattern which is disposed on the insulating layer and overlaps with at least some connection substrates of the plurality of connection substrates, and a plurality of connection lines disposed on the plurality of connection substrates. The reflection pattern may be electrically connected to at least some of the plurality of first power lines and at least some of the plurality of second power lines.

The reflection pattern may be configured by a material different from that of the plurality of connection lines and the reflection pattern may have the same or substantially the same shape as the plurality of connection lines and the plurality of connection substrates.

The stretchable display device may further include a contact unit which is disposed between the plurality of pixel substrates and the insulating layer to electrically connect at least some of the plurality of first power lines or at least some of the plurality of second power lines to the reflection pattern.

The stretchable display device may further include a plurality of additional reflection patterns which is disposed between the lower substrate and the insulating layer to be spaced apart from the plurality of pixel substrates and the plurality of connection substrates. The additional reflection pattern may be configured by the same material or substantially the same material as the reflection pattern.

Although the embodiments of the present disclosure have been described in detail with reference to the accompanying drawings, the present disclosure is not limited thereto and may be embodied in many different forms without departing from the technical concept of the present disclosure. Therefore, the embodiments of the present disclosure are provided for illustrative purposes only but not intended to limit the technical concept of the present disclosure. The scope of the technical concept of the present disclosure is not limited thereto. Therefore, it should be understood that the above-described embodiments are illustrative in all aspects and do not limit the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A stretchable display device, comprising:
   a lower substrate;
   a plurality of pixel substrates which is disposed on the lower substrate to be spaced apart from each other;
   a plurality of first power lines disposed on the plurality of pixel substrates;
   a plurality of second power lines disposed on the plurality of pixel substrates;
   a plurality of driving transistors which is disposed on the plurality of pixel substrates and is electrically connected to the plurality of second power lines; and
   a plurality of light emitting diodes, each of which is disposed on a respective one of the plurality of pixel substrates and includes:
      an anode directly and electrically connected to a respective one of the plurality of first power lines,
      and a cathode electrically connected to the plurality of driving transistors.

2. The stretchable display device according to claim 1, further comprising:
   a plurality of switching transistors, each of which is disposed on the respective ones of the plurality of pixel substrates and is electrically connected to respective ones of the plurality of driving transistors;

a plurality of sensing transistors, each of which is disposed on the respective ones of the plurality of pixel substrates and is electrically connected to the respective ones of the plurality of driving transistors and respective ones of the plurality of light emitting diodes;

a plurality of N-th scan lines disposed on the plurality of pixel substrates; and a plurality of N+1-th scan lines disposed on the plurality of pixel substrates, wherein a gate electrode of a switching transistor of the plurality of switching transistors and a gate electrode of a sensing transistor of the plurality of sensing transistors on one pixel substrate among the plurality of pixel substrates are simultaneously electrically connected to one N-th scan line among the plurality of N-th scan lines, wherein N is a natural number.

3. The stretchable display device according to claim 2, wherein the plurality of pixel substrates includes:

a plurality of first pixel substrates disposed in an N-th row; and a plurality of second pixel substrates disposed in an N+1-th row, wherein an N-th scan line disposed on the plurality of first pixel substrates among the plurality of N-th scan lines is electrically connected to the gate electrode of the switching transistor and the gate electrode of the sensing transistor on the plurality of first pixel substrates, wherein an N-th scan line disposed on the plurality of second pixel substrates, among the plurality of N-th scan lines, is electrically connected to a source electrode of the sensing transistor on the plurality of second pixel substrates, wherein an N+1-th scan line disposed on the plurality of first pixel substrates, among the plurality of N+1-th scan lines, is electrically connected to the source electrode of the sensing transistor, and wherein an N+1-th scan line disposed on the plurality of second pixel substrates, among the plurality of N+1-th scan lines, is electrically connected to the gate electrode of the switching transistor and the gate electrode of the sensing transistor on the plurality of second pixel substrates.

4. The stretchable display device according to claim 3, further comprising:

a plurality of first connection substrates which connects the plurality of pixel substrates in a row direction;

a plurality of second connection substrates which connects the plurality of pixel substrates in a column direction; and an auxiliary scan line which is disposed on some of the second connection substrates among the plurality of second connection substrates and electrically connects an N-th scan line on the plurality of first pixel substrates and an N-th scan line on the plurality of second pixel substrates, among the plurality of N-th scan lines.

5. The stretchable display device according to claim 4, wherein the auxiliary scan line electrically connects an N+1-th scan line on the plurality of first pixel substrates and an N+1-th scan line on the plurality of second pixel substrates, among the plurality of N+1-th scan lines.

6. The stretchable display device according to claim 5, wherein the plurality of pixel substrates further includes a plurality of third pixel substrates disposed in an N+2-th row, and an auxiliary second power line is further disposed on some of the second connection substrates among the plurality of second connection substrates so as to electrically connect second power lines disposed on the plurality of second pixel substrates and the plurality of third pixel substrates, among the plurality of second power lines.

7. The stretchable display device according to claim 6, wherein the plurality of N-th scan lines and the auxiliary scan line, the plurality of N+1-th scan lines and the auxiliary scan line, and the plurality of second power lines and the auxiliary second power line form a mesh shape, individually.

8. The stretchable display device according to claim 4, further comprising:

an insulating layer which is disposed on the plurality of light emitting diodes and at least partially covering the lower substrate;

a reflection pattern which is disposed on the insulating layer and overlaps with at least some of the first connection substrates and at least some of the second connection substrates, among the plurality of first connection substrates and the plurality of second connection substrates; and an upper substrate at least partially covering the reflection pattern and the insulating layer, wherein the reflection pattern has the same or substantially the same shape as the plurality of first connection substrates and the plurality of second connection substrates.

9. The stretchable display device according to claim 8, wherein the reflection pattern includes a transition metal having an s shell as an outer shell in which an energy difference of the s shell and a d shell adjacent to the s shell is 2.7 eV or higher.

10. The stretchable display device according to claim 8, wherein the reflection pattern includes any one of silver (Ag), silver alloy (Ag-alloy), aluminum (Al), aluminum alloy (Al-alloy), molybdenum (Mo), and titanium (Ti).

11. The stretchable display device according to claim 8, further comprising:

a contact unit which connects the plurality of first power lines or the plurality of second power lines to the reflection pattern through a contact hole of the insulating layer.

12. The stretchable display device according to claim 8, further comprising:

an additional reflection pattern disposed between the insulating layer and the lower substrate to be spaced apart from the plurality of pixel substrates, the plurality of first connection substrates, and the plurality of second connection substrates.

13. The stretchable display device according to claim 8, wherein the insulating layer includes the same material or substantially the same material as the upper substrate.

14. A stretchable display device, comprising:

a lower substrate which includes a plurality of pixel substrates spaced apart from each other and a plurality of connection substrates which encloses the plurality of pixel substrates and has a modulus lower than a modulus of each of the plurality of pixel substrates;

wherein the plurality of pixel substrates defines a plurality of sub pixels;

a plurality of light emitting diodes which is disposed on the plurality of pixel substrates, wherein each of the plurality of light emitting diodes includes an anode and a cathode;

a plurality of driving transistors which is disposed on the plurality of pixel substrates, wherein each of the plurality of driving transistors is electrically connected to a respective cathode of the plurality of light emitting diodes;

a plurality of first power lines which is disposed on the plurality of pixel substrates, wherein each of the plurality of first power lines is directly and electrically connected to a respective anode of the plurality of light emitting devices;

a plurality of second power lines which is disposed on the plurality of pixel substrates and is electrically connected to the plurality of driving transistors; and wherein the plurality of connection substrates connects the plurality of pixel substrates to each other.

15. The stretchable display device according to claim 14, further comprising:

a plurality of switching transistors which is disposed on the plurality of pixel substrates and is electrically connected to gate electrodes of the plurality of driving transistors;

a plurality of sensing transistors which is disposed on the plurality of pixel substrates and is electrically connected to and between the plurality of driving transistors and the plurality of light emitting diodes; and a plurality of scan lines which is disposed on the plurality of pixel substrates and is electrically connected to gate electrodes of the plurality of switching transistors and gate electrodes of the plurality of sensing transistors.

16. The stretchable display device according to claim 15, wherein the plurality of pixel substrates includes:

a plurality of first pixel substrates disposed in a plurality of N-th rows;

a plurality of second pixel substrates which is disposed in a plurality of N+1-th rows adjacent to the plurality of N-th rows;

a plurality of third pixel substrates which is disposed in a plurality of N+2-th rows adjacent to the plurality of N+1-th rows; and a plurality of fourth pixel substrates which is disposed in a plurality of N+3-th rows between the plurality of N+2-th rows and the plurality of N-th rows, wherein the plurality of scan lines includes:

an N-th scan line disposed on the plurality of pixel substrates; and an N+1-th scan line disposed on the plurality of pixel substrates, wherein N is a natural number.

17. The stretchable display device according to claim 16, wherein the N-th scan line is electrically connected to the gate electrodes of the plurality of switching transistors and the gate electrodes of the plurality of sensing transistors on the plurality of first pixel substrates and the plurality of third pixel substrates, the N-th scan line is electrically connected to the source electrodes of the plurality of sensing transistors on the plurality of second pixel substrates and the plurality of fourth pixel substrates, the N+1-th scan line is electrically connected to the source electrodes of the plurality of sensing transistors on the plurality of first pixel substrates and the plurality of third pixel substrates, and the N+1-th scan line is electrically connected to the gate electrodes of the plurality of switching transistors and the gate electrodes of the plurality of sensing transistors on the plurality of second pixel substrates and the plurality of fourth pixel substrates.

18. The stretchable display device according to claim 17, further comprising:

an auxiliary scan line which is disposed on some of the plurality of connection substrates which connect the plurality of first pixel substrates and the plurality of second pixel substrates, among the plurality of connection substrates and the other ones of the plurality of connection substrates which connect the plurality of third pixel substrates and the plurality of fourth pixel substrates, wherein the auxiliary scan line electrically connects the N-th scan line of the plurality of first pixel substrates and the N-th scan line of the plurality of second pixel substrates, wherein the auxiliary scan line electrically connects the N-th scan line of the plurality of third pixel substrates and the N-th scan line of the plurality of fourth pixel substrates.

19. The stretchable display device according to claim 17, wherein components of the plurality of N-th rows and the plurality of N+1-th rows form the same or substantially the same structure as components of the plurality of N+2-th rows and the plurality of N+3-th rows, and components of the plurality of N-th rows and components of the plurality of N+1-th rows form vertical symmetry.

20. The stretchable display device according to claim 16, further comprising:

an auxiliary second power line which is disposed on some of the plurality of connection substrates which connect the plurality of first pixel substrates and the plurality of fourth pixel substrates, among the plurality of connection substrates and the other ones of the plurality of connection substrates which connect the plurality of second pixel substrates and the plurality of third pixel substrates, wherein the auxiliary second power line electrically connects the second power lines on the plurality of first pixel substrates and the plurality of fourth pixel substrates and electrically connects the second power lines on the plurality of second pixel substrates and the plurality of third pixel substrates.

21. The stretchable display device according to claim 14, further comprising:

an insulating layer which is disposed on the plurality of light emitting diodes and the plurality of connection substrates;

a reflection pattern which is disposed on the insulating layer and overlaps with at least some connection substrates of the plurality of connection substrates; and a plurality of connection lines disposed on the plurality of connection substrates, wherein the reflection pattern is electrically connected to at least some of the plurality of first power lines and at least some of the plurality of second power lines.

22. The stretchable display device according to claim 21, wherein the reflection pattern includes a material different from that of the plurality of connection lines, and the reflection pattern has the same or substantially the same shape as the plurality of connection lines and the plurality of connection substrates.

23. The stretchable display device according to claim 21, further comprising:

a contact unit which is disposed between the plurality of pixel substrates and the insulating layer to electrically connect either at least some of the plurality of first power lines or at least some of the plurality of second power lines to the reflection pattern.

24. The stretchable display device according to claim 21, further comprising:
a plurality of additional reflection patterns which is disposed between the lower substrate and the insulating layer to be spaced apart from the plurality of pixel substrates and the plurality of connection substrates,
wherein the plurality of additional reflection patterns includes the same material or substantially the same material as the reflection pattern.

* * * * *